United States Patent
Butt et al.

(10) Patent No.: US 10,446,442 B2
(45) Date of Patent: Oct. 15, 2019

(54) INTEGRATED CIRCUIT CHIP WITH MOLDING COMPOUND HANDLER SUBSTRATE AND METHOD

(71) Applicant: GLOBALFOUNDRIES INC., Grand Cayman (KY)

(72) Inventors: Shahid A. Butt, Ossining, NY (US); Christopher L. Tessler, Poughquag, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 109 days.

(21) Appl. No.: 15/386,097

(22) Filed: Dec. 21, 2016

(65) Prior Publication Data
US 2018/0174948 A1    Jun. 21, 2018

(51) Int. Cl.
*H01L 21/683* (2006.01)
*H01L 21/768* (2006.01)
(Continued)

(52) U.S. Cl.
CPC .... *H01L 21/76895* (2013.01); *H01L 21/6835* (2013.01); *H01L 21/76898* (2013.01);
(Continued)

(58) Field of Classification Search
CPC .......................... H01L 21/76251–76259; H01L 27/1203–1211; H01L 2221/68336
(Continued)

(56) References Cited

U.S. PATENT DOCUMENTS

| | | | |
|---|---|---|---|
| 4,972,008 A | * | 11/1990 | Lee ........................ C08G 83/001 523/203 |
| 6,710,444 B2 | | 3/2004 | Xie et al. |

(Continued)

OTHER PUBLICATIONS

Joachim N. Burghartz, "Silicon RF Technology—The Two Generic Approaches", IBM T. J. Watson Research Center, Yorktown Heights, New York 10598, USA, published in Solid-State Device Research Conference,Proceeding of the 27th European, 1997, pp. 1-12.

(Continued)

*Primary Examiner* — Cory W Eskridge
(74) *Attorney, Agent, or Firm* — Gibb & Riley, LLC; Michael J. LeStrange, Esq.

(57) ABSTRACT

Disclosed are integrated circuit (IC) chip structures (e.g., radio frequency (RF) IC chip structures) and methods of forming the structures with an electrically insulative molding compound handler substrate. Each structure includes at least: an electrically insulative molding compound handler substrate; an insulator layer on the handler substrate; and one or more semiconductor devices (e.g., RF semiconductor devices) on the insulator layer. Each method includes at least: attaching a temporary carrier above back end of the line (BEOL) metal levels, which are over an interlayer dielectric layer covering one or more semiconductor devices; removing at least a portion of a semiconductor handler substrate, which is below the semiconductor device(s) and separated therefrom by an insulator layer; replacing the semiconductor handler substrate with a replacement handler substrate made of an electrically insulative molding compound; and removing the temporary carrier. The molding compound handler substrate provides backside isolation that prevents unwanted noise coupling.

20 Claims, 23 Drawing Sheets

(51) Int. Cl.
*H01L 23/48* (2006.01)
*H01L 23/66* (2006.01)
*H01L 21/84* (2006.01)
*H01L 27/12* (2006.01)
*H01L 29/78* (2006.01)
*H01L 49/02* (2006.01)
*H01L 29/40* (2006.01)
*H01L 23/367* (2006.01)

(52) U.S. Cl.
CPC ............ *H01L 21/84* (2013.01); *H01L 23/481* (2013.01); *H01L 23/66* (2013.01); *H01L 27/1203* (2013.01); *H01L 29/78* (2013.01); *H01L 23/367* (2013.01); *H01L 28/40* (2013.01); *H01L 29/402* (2013.01); *H01L 2221/68363* (2013.01); *H01L 2223/6666* (2013.01); *H01L 2223/6672* (2013.01); *H01L 2223/6677* (2013.01)

(58) Field of Classification Search
USPC ......................................................... 438/464
See application file for complete search history.

(56) References Cited

U.S. PATENT DOCUMENTS

| | | | |
|---|---|---|---|
| 7,166,520 B1 | 1/2007 | Henley | |
| 7,265,030 B2 | 9/2007 | Maa et al. | |
| 7,294,521 B2* | 11/2007 | Yoo | H01L 33/0079 438/46 |
| 8,530,753 B2* | 9/2013 | Kunimoto | H01L 21/568 174/255 |
| 9,455,187 B1* | 9/2016 | Gambino | H01L 29/0649 |
| 9,514,987 B1* | 12/2016 | Gambino | H01L 21/76898 |
| 2008/0150118 A1* | 6/2008 | Van Veen | H01L 21/6835 257/688 |
| 2008/0237842 A1 | 10/2008 | Manepalli | |
| 2009/0129210 A1* | 5/2009 | Yamaguchi | G04C 10/02 368/205 |
| 2010/0177416 A1* | 7/2010 | Jo | G02B 1/11 359/885 |
| 2013/0102112 A1* | 4/2013 | Chen | H01L 24/75 438/118 |
| 2014/0167209 A1* | 6/2014 | Meiser | H01L 21/76224 257/506 |
| 2014/0252567 A1* | 9/2014 | Carroll | H01L 21/0237 257/635 |
| 2014/0357020 A1* | 12/2014 | Aleksov | H01L 24/82 438/107 |
| 2015/0115416 A1* | 4/2015 | Costa | H01L 23/3737 257/632 |
| 2015/0137383 A1 | 5/2015 | Toh et al. | |
| 2015/0371905 A1* | 12/2015 | Carroll | H01L 21/84 257/351 |
| 2015/0376066 A1 | 12/2015 | Miyazawa | |
| 2016/0005643 A1 | 1/2016 | Miyazawa et al. | |
| 2016/0141198 A1* | 5/2016 | Broekaart | H01L 21/6835 438/458 |
| 2016/0336279 A1* | 11/2016 | Mason | H04B 1/401 |
| 2016/0379943 A1* | 12/2016 | Mason | H01L 23/66 257/506 |

OTHER PUBLICATIONS

Joachim N. Burghartz, "Progress in RF Inductors on Silicon—Understanding Substrate Losses", IEEE, 1998, pp. 523-526.
Ronald Dekker et al., "Substrate Transfer for RF Technologies", IEEE Transactions on Electron Devices, vol. 50, No. 3, Mar. 2003, pp. 747-757.
Li Li, "Embedded Passives in Organic Substrate for RF Module and Assembly Characterization", Proceeding of HDP 2004, pp. 74-82.
Gaurav Sharma et al., "Embedded Wafer Level Packages with Laterally Placed and Vertically Stacked Thin Dies", IEEE, 2009, pp. 1537-1543.
Dong Kil Shin et al., "Effective Material Properties and Thermal Stress Analysis of Epoxy Molding Compound in Electronic Packaging", IEEE, vol. 21, No. 4, Nov. 1998, pp. 413-421.
Sumitomo, "Environmentally Friendly Epoxy Molding Compound for Semiconductor", date unknown, p. 1.
Andrew A. Wereszczak et al., "Thermally Conductive MgO-Filled Epoxy Molding Compounds", IEEE Transactions on Components, Packaging and Manufacturing Technology (vol. 3, Issue: 12, Dec. 2013 ), pp. 1994-2005.
L. Li et al., "Characterization of transfer molding effects on RF performance of power amplifier module", Electronic Components and Technology Conference, Aug. 16, 2004. Proceedings. 54th, Abstract.

* cited by examiner

INTEGRATED CIRCUIT CHIP WITH MOLDING COMPOUND HANDLER SUBSTRATE AND METHOD

FIELD OF THE INVENTION

The present invention relates to integrated circuit (IC) chips and, more particularly, radio frequency (RF) IC chips and methods of forming the chips so as to have an electrically insulative handler substrate for optimal performance.

BACKGROUND

More specifically, a radio frequency (RF) integrated circuit (IC) chip is an IC chip that incorporates RF semiconductor devices (e.g., RF transistors, etc.). RF semiconductor devices are semiconductor devices that operate within a frequency range suitable for transmission and/or receipt of radio frequency (RF) signals (e.g., within a frequency range of 3 KHz to 300 GHz). RFIC chips are typically formed using a silicon-on-insulator (SOI) wafer. That is, they include a semiconductor handler substrate (e.g., a silicon handler substrate), an insulator layer (e.g., a buried oxide (BOX) layer) on the semiconductor handler substrate and RF semiconductor devices in a silicon layer above the insulator layer. Unfortunately, when RF semiconductor devices operate at a high frequency (e.g., 3-300 MHz), an ultra-high frequency (e.g., 300 MHz to 30 GHz), or an even higher frequency, free electrons can move through the semiconductor handler substrate, resulting in noise coupling of the RF semiconductor devices (i.e., cross-talk between the devices) and such noise coupling can negatively impact product performance.

SUMMARY

In view of the foregoing, disclosed herein are integrated circuit (IC) chip structures (e.g., radio frequency (RF) IC chip structures) and methods of forming the structures with an electrically insulative molding compound handler substrate. Specifically, each of the disclosed IC chip structures include at least: an electrically insulative molding compound handler substrate; an insulator layer on the handler substrate; and one or more semiconductor devices (e.g., RF semiconductor devices) on the insulator layer. Process steps in each of the disclosed methods include at least: attaching a temporary carrier above back end of the line (BEOL) metal levels, which are over an interlayer dielectric layer covering one or more semiconductor devices; removing at least a portion of a semiconductor handler substrate, which is below the semiconductor device(s) and separated therefrom by an insulator layer; replacing the semiconductor handler substrate with a replacement handler substrate made of an electrically insulative molding compound; and removing the temporary carrier. The molding compound handler substrate provides backside isolation that prevents unwanted noise coupling of devices.

More particularly, disclosed herein are integrated circuit (IC) chip structures (e.g., radio frequency (RF) IC chip structures). Each IC chip structure can include a replacement handler substrate, which is made of a molding compound that is electrically insulative. Each IC chip structure can further include an insulator layer (e.g., a buried oxide (BOX) layer), which has a first surface immediately adjacent to the replacement handler substrate and a second surface opposite the first surface. Each IC chip structure can further include one or more semiconductor devices (e.g., one or more RF semiconductor devices) within a semiconductor layer (e.g., within a silicon layer) on the second surface of the insulator layer. Each IC chip structure can also include an interlayer dielectric (ILD) layer over the semiconductor device(s) and metal levels above the ILD layer. The replacement handler substrate, which as mentioned above is made of a molding compound that is electrically insulative, provides backside isolation that prevents unwanted noise coupling. Optionally, a semiconductor body (e.g., a silicon body), which is or contains at least one functional semiconductor feature, can be immediately adjacent to the first surface of the insulator layer. In this case, the replacement handler substrate can be on the first surface of the insulator layer positioned laterally adjacent to the semiconductor body and can further extend over (i.e., cover) the semiconductor body. Optionally, the replacement handler substrate can be a multi-layer handler substrate, which includes: a first molding compound layer immediately adjacent to the insulator layer and a second molding compound layer on the first molding compound layer. Such a multi-layer handler substrate can contain a metal device between the first molding compound layer and the second molding compound layer.

Also, disclosed herein are methods of forming integrated circuit (IC) chip structures (e.g., radio frequency (RF) IC chip structures). Each of the methods includes providing a semiconductor-on-insulator wafer (e.g., a silicon-on-insulator (SOI) wafer). The wafer can have a semiconductor handler substrate (e.g., a silicon handler substrate), an insulator layer (e.g., a buried oxide (BOX) layer) on the semiconductor handler substrate and a semiconductor layer (e.g., a silicon layer) on the insulator layer. Specifically, the insulator layer can have a first surface immediately adjacent to the semiconductor handler substrate and a second surface opposite the first surface and immediately adjacent to the semiconductor layer. One or more semiconductor devices (e.g., RF semiconductor devices) can be formed using the semiconductor layer. Subsequently, at least one interlayer dielectric (ILD) layer can be formed over the semiconductor device(s), metal levels can be formed above the ILD layer and a temporary carrier can be attached above the metal levels. After the temporary carrier is attached, the semiconductor handler substrate can be removed (in part or in whole, as discussed below) from the insulator layer and can be replaced with a replacement handler substrate. The replacement handler substrate can specifically be made of a molding compound, which is electrically insulative. After the replacement handler substrate is formed, the temporary carrier can be removed.

In the disclosed methods, the semiconductor handler substrate can be removed in whole or in part. That is, the semiconductor handler substrate can be entirely removed or only partially removed. Furthermore, the replacement handler substrate can, optionally, be formed so as to contain one or more semiconductor and/or metal features.

Specifically, in one particular method embodiment, a semiconductor-on-insulator wafer (e.g., a silicon-on-insulator (SOI) wafer) can be provided, as described above. One or more semiconductor devices (e.g., RF semiconductor devices) can be formed in the semiconductor layer above the insulator layer. Subsequently, at least one interlayer dielectric (ILD) layer can be formed over the semiconductor device(s), metal levels can be formed above the ILD layer and a temporary carrier can be attached above a last metal level. After the temporary carrier is attached, the semiconductor handler substrate can be patterned such that at least one portion (referred to herein as a semiconductor body) remains immediately adjacent to the first surface of the insulator layer. As discussed further in the detailed description section below, at least one functional semiconductor feature can be formed using this semiconductor body. Subsequently, a replacement handler substrate can be formed on the first surface of the insulator layer, to replace the removed portion of the semiconductor handler substrate, such that it is positioned laterally adjacent to and extends over the semiconductor body. Again, the replacement handler substrate can specifically be made of a molding compound, which is electrically insulative, and, after the replacement handler substrate is formed, the temporary carrier can be removed.

In another particular method embodiment, a semiconductor-on-insulator wafer (e.g., a silicon-on-insulator (SOI) wafer) can be provided, as described above. One or more semiconductor devices (e.g., RF semiconductor devices) can be formed in the semiconductor layer above the insulator layer. Subsequently, at least one interlayer dielectric (ILD) layer can be formed over the semiconductor device(s), metal levels can be formed above the ILD layer and a temporary carrier can be attached above a last metal level. After the temporary carrier is attached, the semiconductor handler substrate can be removed from the insulator layer and replaced with a replacement handler substrate, which is multi-layered and which contains at least one metal device. Specifically, the replacement handler substrate can be formed by forming a first molding compound layer on the first surface of the insulator layer and forming a second molding compound layer on the first molding compound layer. These molding compound layers can be electrically insulative. During this process and, particularly, before formation of the second molding compound layer, a metal device can be formed on the first molding compound layer. The second molding compound layer can further be formed such that it is on the first molding compound layer and extends over the metal device. After the replacement handler substrate is formed, the temporary carrier can be removed.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
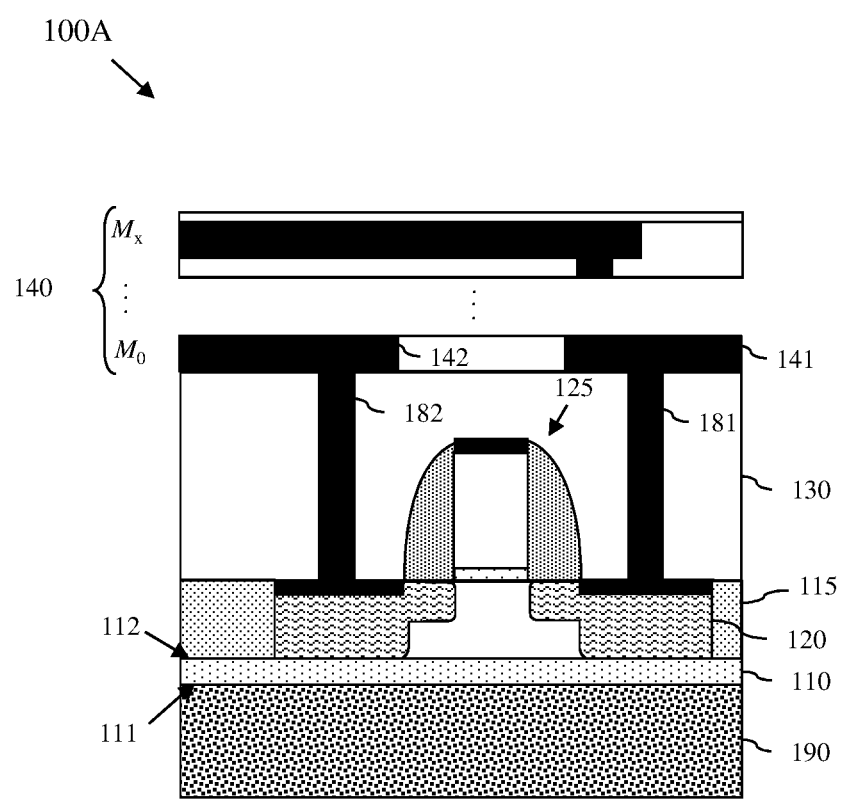
FIGS. 1-5 are cross-section diagrams illustrating various embodiments of the disclosed integrated circuit (IC) structures, each having an electrically insulative molding compound handler substrate.

As mentioned above, a radio frequency (RF) integrated circuit (IC) chip is an IC chip that incorporates RF semiconductor devices (e.g., RF transistors, etc.). RF semiconductor devices are semiconductor devices that operate within a frequency range suitable for transmission and/or receipt of radio frequency (RF) signals (e.g., within a frequency range of 3 KHz to 300 GHz). RFIC chips are typically formed using a silicon-on-insulator (SOI) wafer. That is, they include a semiconductor handler substrate (e.g., a silicon handler substrate), an insulator layer (e.g., a buried oxide (BOX) layer) on the semiconductor handler substrate and RF semiconductor devices in a silicon layer above the insulator layer. Unfortunately, when RF semiconductor devices operate at a high frequency (e.g., 3-300 MHz), an ultra-high frequency (e.g., 300 MHz to 30 GHz), or an even higher frequency, free electrons can move through the semiconductor handler substrate, resulting in noise coupling (e.g., cross-talk between RF semiconductor devices) and such noise coupling can negatively impact product performance. One technique for isolating RF devices to limit noise coupling is to use an SOI wafer with a high-resistance semiconductor handler substrate. However, such SOI wafers are expensive and even a high-resistance semiconductor handler substrate may not provide adequate isolation. Another technique for isolating RF devices to limit noise coupling is to replace the semiconductor handler substrate of a standard SOI wafer with an insulator handler substrate and, particularly, with a glass handler substrate. However, current process flows for replacing the semiconductor handler substrate with a glass handler substrate can be complex and costly.

In view of the foregoing, disclosed herein are integrated circuit (IC) chip structures (e.g., radio frequency (RF) IC chip structures) and methods of forming the structures with an electrically insulative molding compound handler substrate. Specifically, each of the disclosed IC chip structures includes at least: an electrically insulative molding compound handler substrate; an insulator layer on the handler substrate; and one or more semiconductor devices (e.g., RF semiconductor devices) on the insulator layer. Process steps in each of the disclosed methods include at least: attaching a temporary carrier above back end of the line (BEOL) metal levels, which are over an interlayer dielectric layer covering one or more semiconductor devices; removing at least a portion of a semiconductor handler substrate, which is below the semiconductor device(s) and separated therefrom by an insulator layer; replacing the semiconductor handler substrate with a replacement handler substrate made of an electrically insulative molding compound; and removing the temporary carrier. The molding compound handler substrate provides backside isolation that prevents unwanted noise coupling.

More particularly, referring to FIGS. 1, 2, 3, 4 and 5, disclosed herein are integrated circuit (IC) chip structures 100A, 100B, 100B', 100C, and 100D, respectively (e.g., radio frequency (RF) IC chip structures). Each IC chip structure 100A, 100B, 100B', 100C and 100D can include a replacement handler substrate 190, which is made of a molding compound that is electrically insulative and, optionally, thermally conductive. Those skilled in the art will recognize that a molding compound (also referred to as a mold compound) is a material that can be molded or formed into a shape (e.g., by a compression molding process, an injection molding process, etc.). The molding compound material may be, for example, an organic, polymer, plastic, or epoxy material or any other suitable molding compound material. The molding compound material may further contain filler particles, which are distributed approximately uniformly throughout the material. The filler particles can all be the same type of filler particle. Alternatively, multiple different types of filler particles could be used. For example, the molding compound material can contain filler particles that are electrically insulative and non-thermally conductive such as glass particles, silica particles, or any other suitable electrically insulative, non-thermally conductive, filler particles). Additionally or alternatively, the molding compound material can contain filler particles that are both electrically insulative and thermally conductive such as aluminum oxide particles, magnesium oxide particles, aluminum nitride particles, or any other suitable electrically insulative, thermally conductive, filler particles. Additionally or alternatively, the molding compound material can contain filler particles that are electrically conductive (e.g., SiC) and the molding compound material (e.g., the organic or polymer material) can provide the necessary insulative properties. In any case, the size of the filler particles could range from several tens of microns to nano-particles. For purposes of this disclosure, an electrically insulative particle has an electrical resistivity ($\rho_e$) of greater than $1\times10^{14}$ Ωcm at room temperature (e.g., 20° C.) and a thermally conductive particle has a thermal conductivity (κ) of at least 15 W/mK at room temperature.

Each IC chip structure 100A, 100B, 100B', 100C and 100D can further include an insulator layer 110 (e.g., a silicon oxide layer, also referred to herein as a buried oxide (BOX) layer, or other suitable insulator layer) and a semiconductor layer 120 (e.g., a silicon layer or other suitable semiconductor layer). The insulator layer 110 can have a first surface 111 immediately adjacent to the replacement handler substrate 190 and a second surface 112 opposite the first surface 111 and immediately adjacent to the semiconductor layer 120.

Each IC chip structure 100A, 100B, 100B', 100C and 100D can further include one or more semiconductor devices 125 (e.g., one or more RF semiconductor devices) within the semiconductor layer 120. For purposes of illustration only a single semiconductor device and, particularly, a single planar field effect transistor (i.e., a single planar FET) is shown in FIGS. 1-5. However, it should be understood that the IC chip structures 100A, 100B, 100B', 100C and 100D disclosed herein can include one or more semiconductor devices of the same or different types including, but not limited to, planar FETs, non-planar FETs (e.g., fin-type FETs), bipolar transistors (BJTs), heterojunction bipolar transistors (HBTs). For a radio frequency (RF) IC chip structure, the semiconductor device(s) can operate within a frequency range suitable for transmission and/or receipt of radio frequency (RF) signals (e.g., within a frequency range of 3 KHz to 300 GHz). For example, the semiconductor device(s) 125 can be configured as high frequency (e.g., 3-300 MHz) devices, ultra-high frequency (e.g., 300 MHz to 30 GHz) devices, etc.

In any case, the semiconductor device(s) 125 can be electrically isolated from each other by, for example, isolation regions 115 (e.g., shallow trench isolation (STI) regions or other suitable isolation regions).

Each IC chip structure 100A, 100B, 100B', 100C and 100D can also include one or more interlayer dielectric (ILD) layers 130 over the semiconductor device(s) 125. The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Various middle of the line (MOL) contacts can extend vertically through the ILD layer(s) 130 to the semiconductor device(s) 125. For example, see MOL contacts 181, 182 that extend vertically through the ILD layer(s) 130 to at least some of the FET source/drain regions shown in FIGS. 1-5. Back end of the line (BEOL) metal levels 140 ($M_0$-$M_x$) above the ILD layer(s) 130 can contain the wires and vias that interconnect on-chip devices and/or enable connection to off-chip devices. For example, see wires 141 and 142, which are in the first metal level ($M_0$). As illustrated, the wire 141 can be immediately adjacent to the contact 181 and/or the wire 142, can be immediately adjacent to the contact 182 in order to enable electrical connection(s) between the semiconductor device 125 and other on-chip device(s) and/or off-chip device(s) (not shown). For purposes of illustration only two metal levels are shown in the figures (namely, the first metal level ($M_0$) (i.e., the lowest metal level) and the last metal level ($M_x$) (i.e., the highest metal level)); however, it should be understood that multiple additional metal levels could be stacked between the first and last metal levels. Optionally, as shown in FIGS. 2, 3, 4 and 5, the IC chip structures 100B, 100B', 100C, and 100D disclosed herein, respectively, can further include one or more functional features contained within the replacement handler substrate 190.

Figure 2:
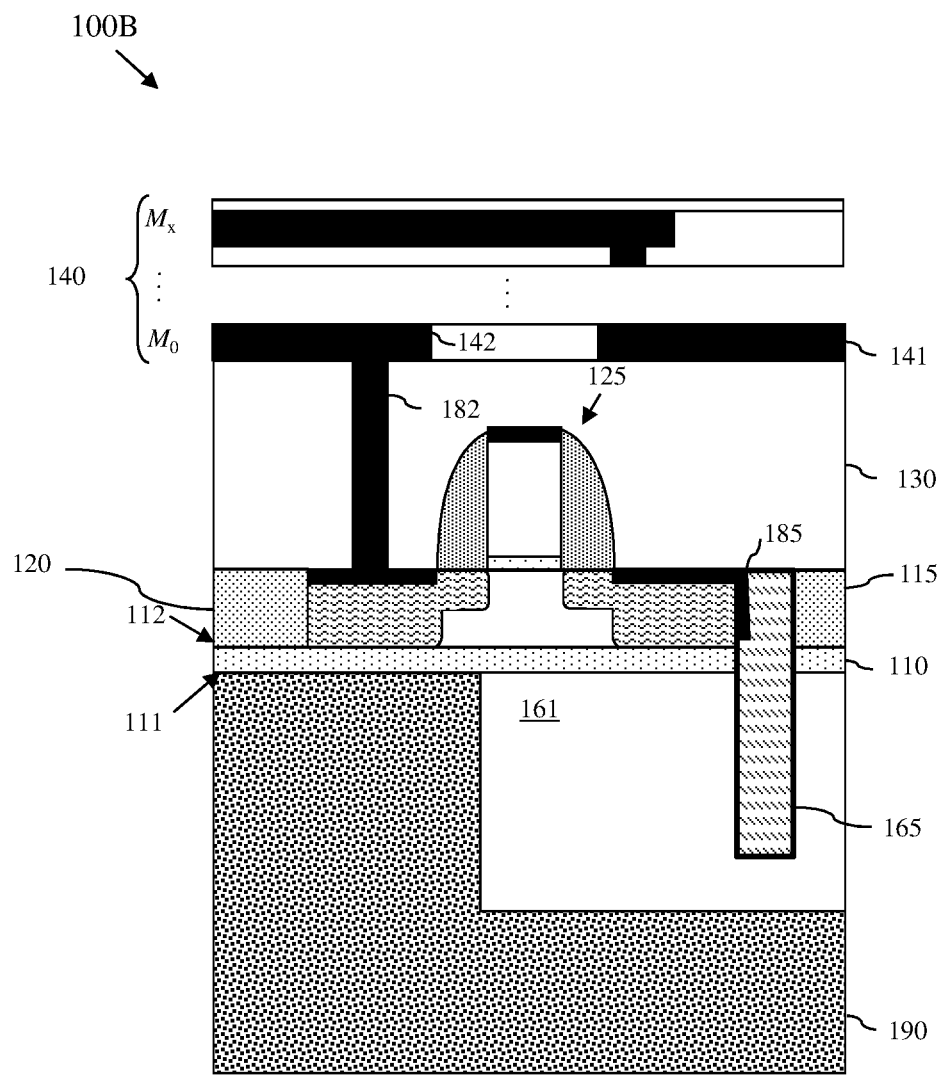
Figure 3:
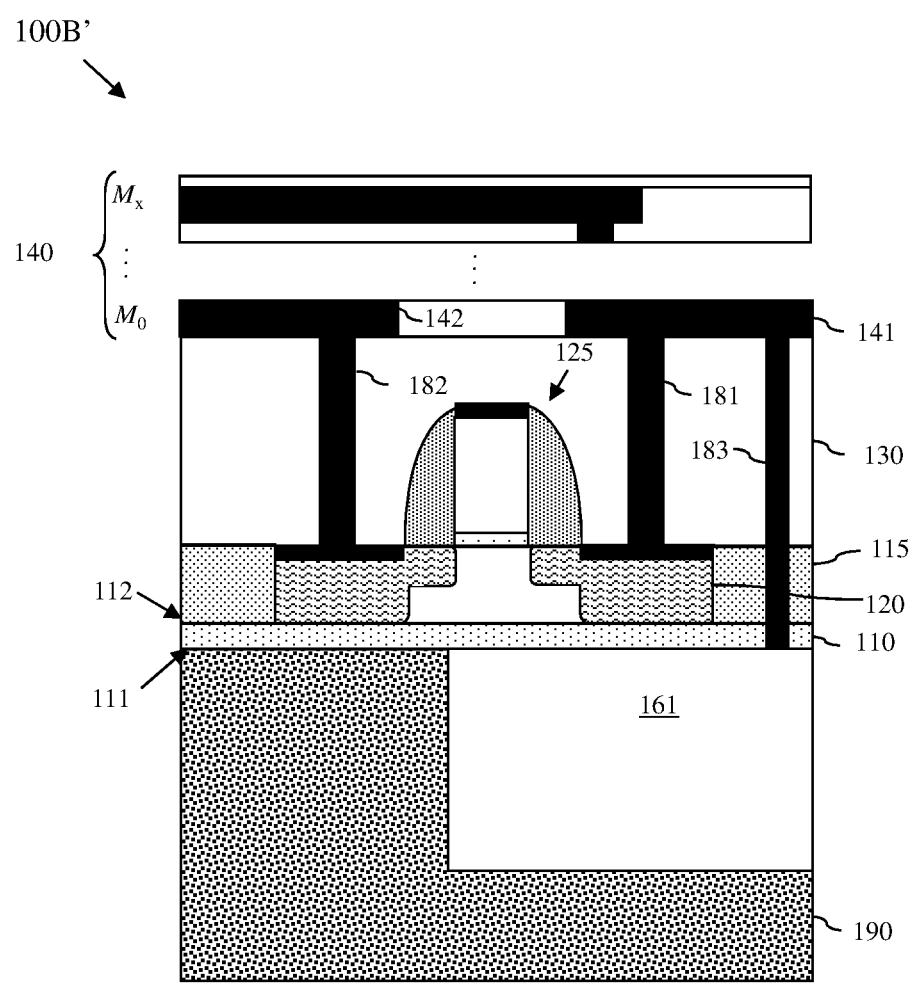

For example, as illustrated in the IC structures 100B of FIGS. 2 and 100B' of FIG. 3, a semiconductor body 161 can be immediately adjacent to the first surface 111 of the insulator layer 110. As discussed in greater detail with regard to the methods, this semiconductor body 161 can be a remaining portion of a semiconductor handler substrate, which was partially removed during processing. This semiconductor body 161 can be configured as or can contain a functional semiconductor feature. For example, as illustrated in the IC structure 100B of FIG. 2, the semiconductor body 161 can be appropriately doped or otherwise processed so as to contain a semiconductor device, such as a deep trench capacitor 165 or portion thereof. Such a deep trench capacitor 165 can, for example, include a deep trench that extends vertically through the semiconductor layer 120 and the insulator layer 110 into the semiconductor body 161. The area of the semiconductor body 161 immediately adjacent to the deep trench can be doped to form a first conductive field plate. The trench can be lined with a dielectric layer and filled with a doped semiconductor material, which forms a second conductive field plate. The deep trench capacitor 165 can, for example, be directly electrically connected to the semiconductor device 125 by a local interconnect 185, thus allowing for a one transistor-one capacitor (1T1C) storage element.

Alternatively, as illustrated in the IC structure 100B' of FIG. 3, the semiconductor body 161 can be appropriately doped or otherwise processed so as to be or contain some other functional semiconductor feature including, but not limited to, a different type of semiconductor device, a conductive, biasable, field plate, a heat sink (which dissipates heat from other on-chip devices) or any other functional semiconductor feature. In this case, the semiconductor body 161 or, more particularly, the functional semiconductor feature(s) can, optionally, be electrically connected to on-chip device(s) (e.g., to the semiconductor device 125, as shown) or off-chip device(s) (not shown) by at least one through BOX via (TBV) 183. Such a TBV 183 can extend vertically from the wire 141 in the first metal level ($M_0$) through the ILD layer 130, through an isolation region 115 within the semiconductor layer 120 and through the insulator layer 110, stopping at the first surface 111 (bottom) of the insulator layer 110 immediately adjacent to the semiconductor body 161. For purposes of illustration, only a single TBV is shown as contacting the semiconductor body 161 in FIG. 3. However, it should be understood that this semiconductor body 161 might be contacted by more than one TBV or no TBV at all, depending upon the type of feature. Furthermore, it should be understood that the backside of this semiconductor body 161 could, additionally or alternatively, be contacted by one or more backside through substrate vias (TSVs) (not shown), which can extend vertically from the backside of the replacement handler substrate 190 opposite the insulator layer 110 to the semiconductor body 161.

Alternatively, the semiconductor body 161 can be a support structure only (i.e., an uncontacted, undoped, semiconductor body simply left on the first surface 111 of the insulator layer 110 to provide mechanical stability).

Figure 4:
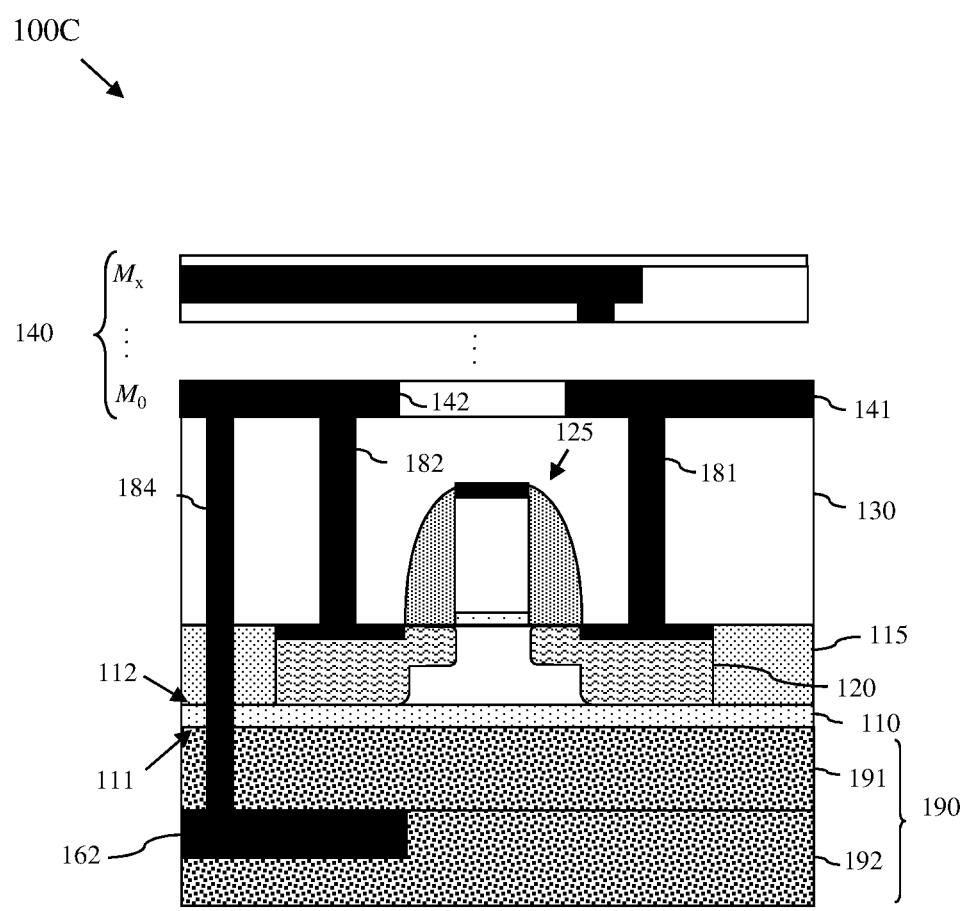
Figure 5:
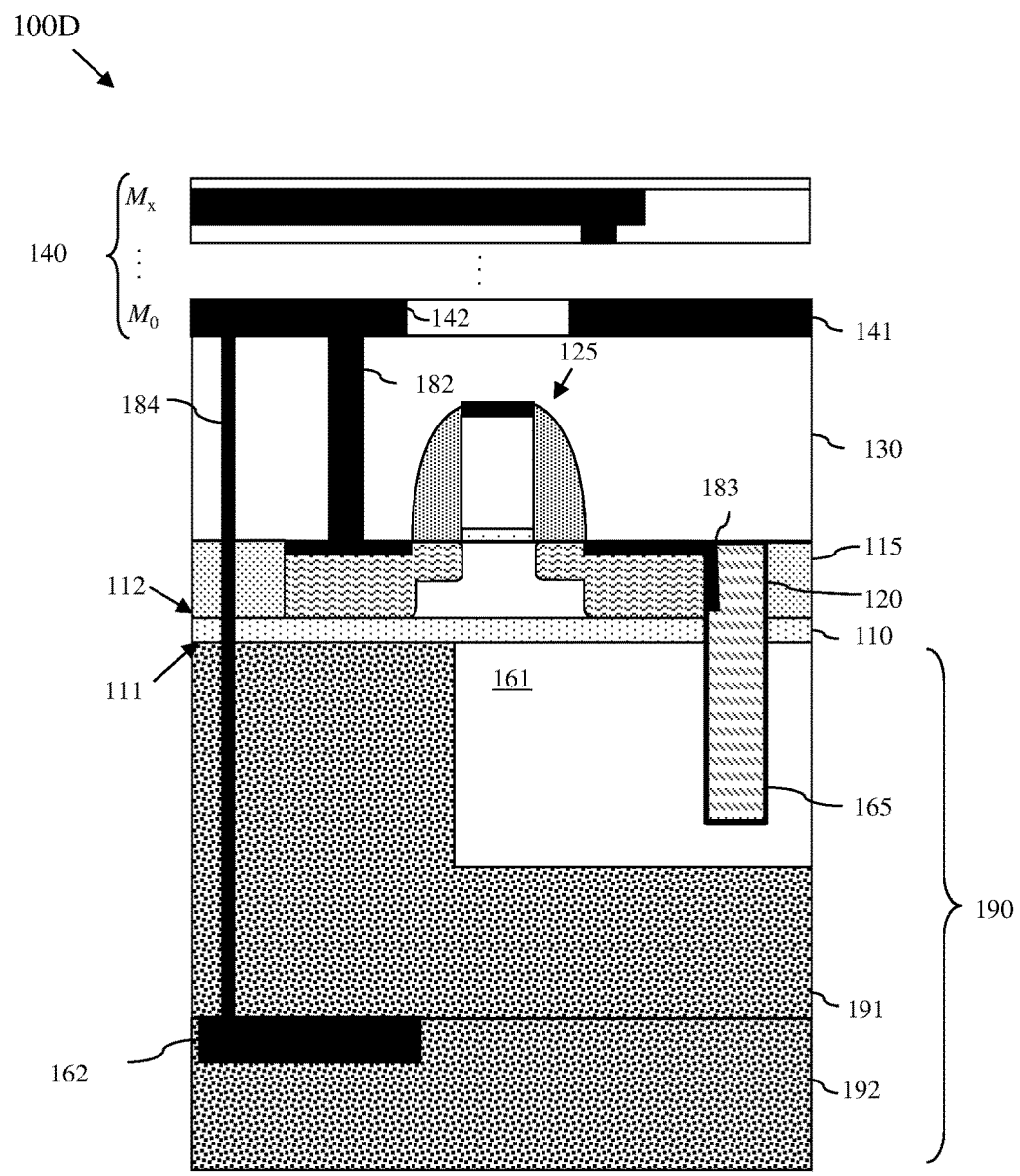

Additionally or alternatively, as shown in the IC structures 100C of FIGS. 4 and 100D of FIG. 5, the replacement handler substrate 190 can be a multi-layer replacement handler substrate. For example, the replacement handler substrate 190 can include a first molding compound layer 191 immediately adjacent to the first surface 111 of the insulator layer 110 and a second molding compound layer 192 on the first molding compound layer 191. Such a multi-layer handler substrate can contain one or more metal devices 162 between the first molding compound layer 191 and the second molding compound layer 192. That is, a metal device 162 can be immediately adjacent to a surface of the first molding compound layer 191 opposite the insulator layer 110. The second molding compound layer 192 can be immediately adjacent to the first molding compound layer 191, positioned laterally adjacent to the metal device 162 and further extending over (i.e., covering) the metal device 162. The metal device 162 can be any of the following: an inductor or other passive device (e.g., a capacitor or resistor); an antenna (e.g., an RF antenna to allow for transmission and receipt of RF signals); a conductive, biasable, field plate; a heat sink; a metal interconnect (e.g., a wire), which provides the electrical connection between on-chip features or between on-chip features and off-chip features, or any other suitable type of metal device.

For purposes of illustration, the multi-layer replacement handler substrate is shown in FIGS. 4 and 5 as a two-layer replacement handler substrate containing only a single metal device 162 between the layers. However, FIGS. 4 and 5 are not intended to be limiting. It should be understood that this multi-layer replacement handler substrate could, alternatively, include more than two molding compound layers and could further include multiple metal devices of the same or different types between the same or different molding compound layers (i.e., at the same or different metal levels within the multi-layer replacement handler substrate 190). Additionally, it should be understood that other material layers (e.g., photosensitive polyimide (PSPI), hard mask layers, etc.) might also be incorporated into the multi-layer replacement handler substrate between the molding compound layers.

In any case, at least one TSV 184 can extend vertically from a wire in one of the metal levels ($M_0$-$M_x$) (e.g., from wire 142 in the first metal level ($M_0$) (as shown) or from a wire in some higher metal level (not shown)) through the ILD layer 130, through an isolation region 115 within the semiconductor layer 120, through the insulator layer 110, and through the first molding compound layer 191 of the replacement handler substrate 190 to the metal device 162. Thus, the metal device 162 can be electrically connected to the semiconductor device 125, as illustrated, or to any other on-chip or off-chip device, necessary. For purposes of illustration, only a single TSV 184 is shown as contacting the metal device 162, described above and optionally contained in the replacement handler substrate 190. However, it should be understood that the metal device 162 might be contacted by more than one TSV or no TSV at all, depending upon the type of feature. Additionally, the backside of any metal device contained within the replacement handler substrate 190 could, additionally or alternatively, be contacted by one or more backside TSVs (not shown), which can extend vertically from the backside of the replacement handler substrate 190 opposite the insulator layer 110 to any device contained in the replacement handler substrate 190. It should be understood that, if the replacement handler substrate 190 is a multi-layer replacement handler substrate that contains multiple metal devices at different levels, these metal devices can be connected to other on-chip and/or off-chip devices through TSVs, as discussed above. Additionally or alternatively, these metal devices can be connected to each other, to other on-chip devices, and/or to off-chip devices through local interconnects and/or vias, which are also contained within the multi-layer replacement handler substrate 190 (not shown).

It should be noted that FIG. 5 shows an IC structure 100D that includes a replacement handler substrate 190 that contains both a semiconductor body 161 with a functional semiconductor feature and a metal device 162. For purposes of illustration, this IC structure 100D represents a combination of the IC structure 100B of FIG. 2, wherein the semiconductor body 161 contains a deep trench capacitor 165, and the IC structure 100C of FIG. 4. However, it should be understood that FIG. 5 is not intended to be limiting and other IC structures are anticipated (e.g., an IC structure that includes a combination of the IC structure 100B' of FIG. 3 and the IC structure 100C of FIG. 4).

In any case, in each of IC chip structures 100A, 100B, 100B', 100C, and 100D described above, the replacement handler substrate 190, which as mentioned above is made of a molding compound that is electrically insulative, provides backside isolation that prevents unwanted noise coupling (e.g., unwanted cross-talk between devices).

Figure 6:
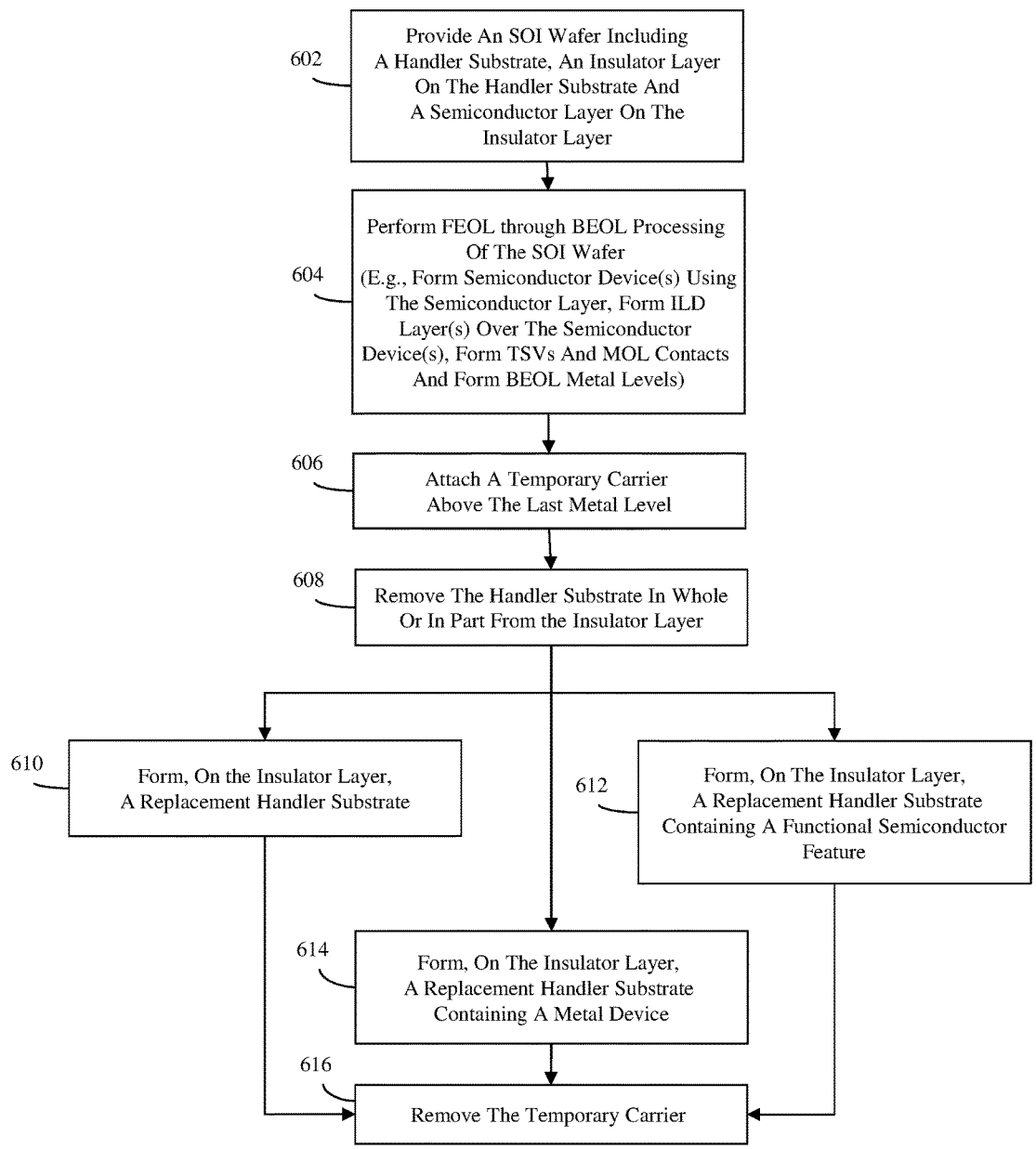
FIG. 6 is a flow diagram illustrating methods of forming the IC structures of FIGS. 1-5.
Figure 7:
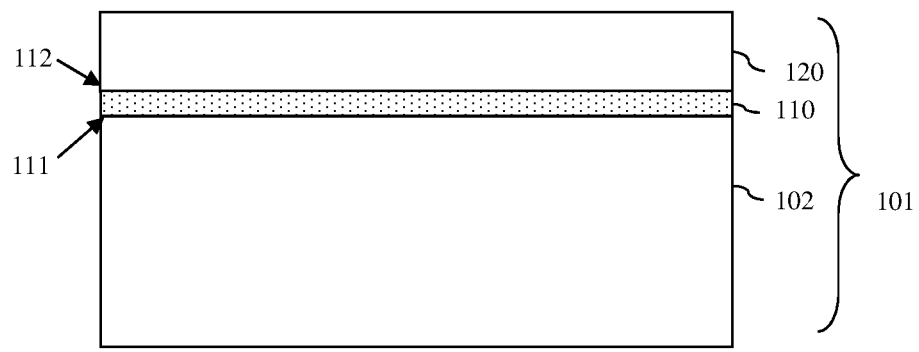
FIGS. 7-23 are cross-section diagrams illustrating partially completed IC structures formed according to the methods of FIG. 6.

Referring to the flow diagram of FIG. 6, also disclosed herein are methods of forming the integrated circuit (IC) chip structures (e.g., radio frequency (RF) IC chip structures) 100A, 100B, 100B', 100C and 100D, as described above and illustrated in FIGS. 1-5, respectively. In the methods, a semiconductor-on-insulator wafer 101 (e.g., a silicon-on-insulator (SOI) wafer) is provided (602, see FIG. 7). The SOI wafer 101 can have a semiconductor handler substrate 102, an insulator layer 110 on the semiconductor handler substrate 102 and a semiconductor layer 120 on the insulator layer. The semiconductor handler substrate 102 can be a silicon handler substrate or any other suitable semiconductor handler substrate. The insulator layer 110 can be a silicon oxide insulator layer (also referred to herein as a buried oxide (BOX) layer) or any other suitable insulator layer. In any case, the insulator layer 110 can have a first surface 111 immediately adjacent to the semiconductor handler substrate 102 and a second surface 112 opposite the first surface and immediately adjacent to the semiconductor layer 120. The semiconductor layer 120 can be a silicon layer or any other suitable semiconductor layer.

Figure 8A:
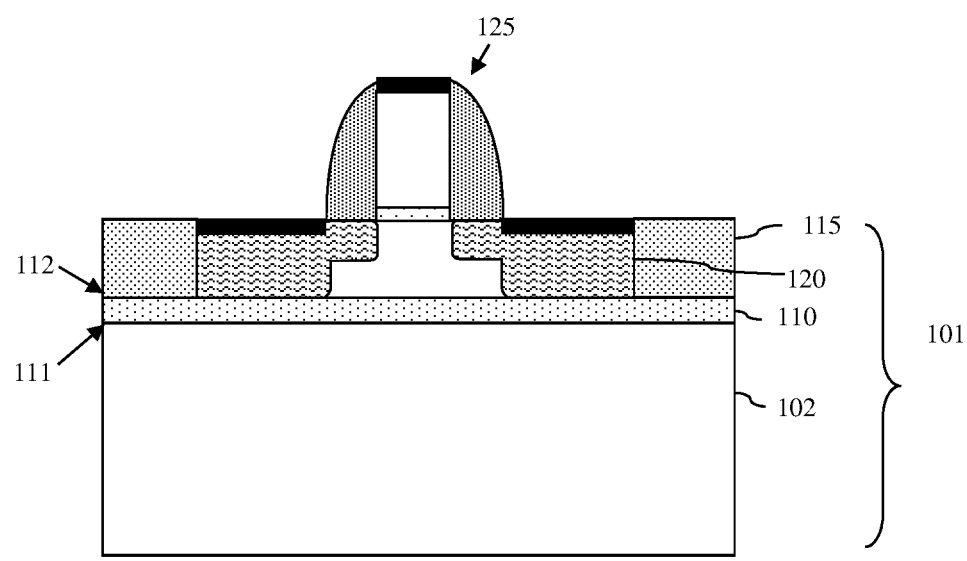
Figure 8B:
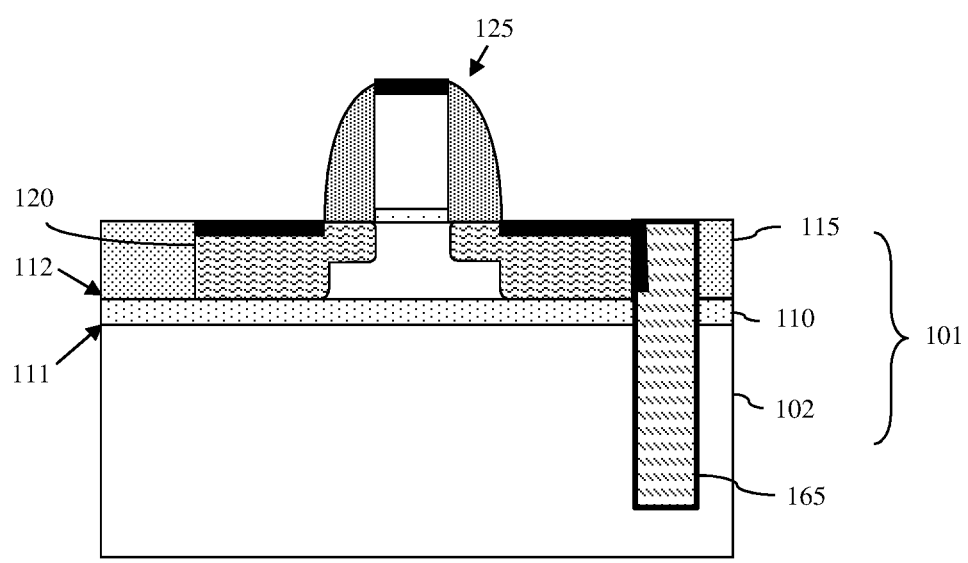

Conventional front end of the line (FEOL) through back end of the line (BEOL) processing can be performed with respect to the SOI wafer 101 (604). Specifically, during FEOL processing, isolation regions 115 can be formed in the semiconductor layer 120 so as to define the active regions for one or more semiconductor device. The isolation regions 115 can be formed, for example, using conventional shallow trench isolation (STI) region formation techniques. Additionally, one or more semiconductor devices 125 (e.g., one or more RF semiconductor devices) can be formed using the semiconductor layer 120 and, particularly, the active regions defined by the isolation regions 115, as shown in FIG. 8A. For purposes of illustration only a single semiconductor device 125 and, particularly, a single planar field effect transistor (i.e., a single planar FET) is shown. However, if should be understood that semiconductor devices formed at process 604 can be of the same or different types including, but not limited to, planar FETs, non-planar FETs (e.g., fin-type FETs), bipolar transistors (BJTs), heterojunction bipolar transistors (HBTs). For a radio frequency (RF) IC chip structure, the semiconductor device(s) 125 can be formed for optimal operation within a frequency range suitable for transmission and/or receipt of radio frequency (RF) signals (e.g., within a frequency range of 3 KHz to 300 GHz). For example, the semiconductor device(s) 125 can be configured as high frequency (e.g., 3-300 MHz) devices, ultra-high frequency (e.g., 300 MHz to 30 GHz) devices, etc. Various different techniques for forming the above-mentioned semiconductor devices are well known in the art and, thus, the details of those techniques have been omitted from this specification in order to allow the reader to focus on the salient aspects of the disclosed methods. Optionally, FEOL processing can further include the formation of one or more additional devices. For example, as shown in FIG. 8B, FEOL processing can include the formation of a deep trench capacitor 165. Such a deep trench capacitor 165 can be formed, for example, by forming a deep trench that extends vertically through the semiconductor layer 120 and the insulator layer 110 into the semiconductor handler substrate 102. The area of the semiconductor handler substrate immediately adjacent to the deep trench can be doped to form a first conductive field plate. A dielectric layer can be deposited to line the trench and a doped semiconductor material, which forms a second conductive field plate, can be deposited so as to fill the trench. The deep trench capacitor 165 can, for example, be directly electrically connected to the semiconductor device 125 by a local interconnect 185, thus allowing for a one transistor-one capacitor (1T1C) storage element.

Following FEOL processing, middle of the line (MOL) and back end of the line (BEOL) processing can be performed. For purposes of illustration, these MOL and BEOL process are shown (unless otherwise stated) with respect to the partially completed IC structure of FIG. 8A. However, it should be understood that essentially the same processes can be performed with respect to the partially completed IC structure shown in FIG. 8B.

Figure 9:
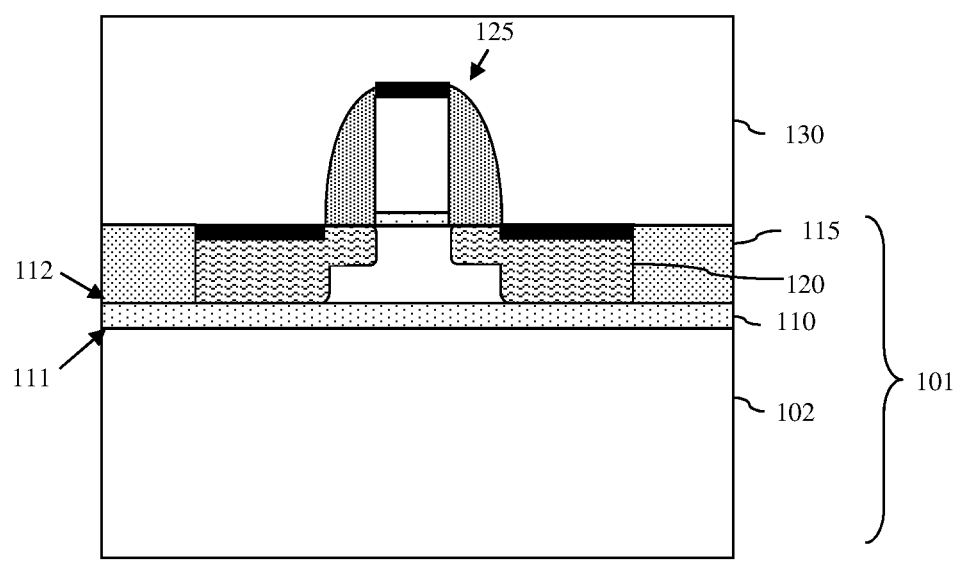

Specifically, one or more interlayer dielectric (ILD) layers 130 can be formed over the semiconductor device(s) 125 (see FIG. 9). The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.).

Figure 10:
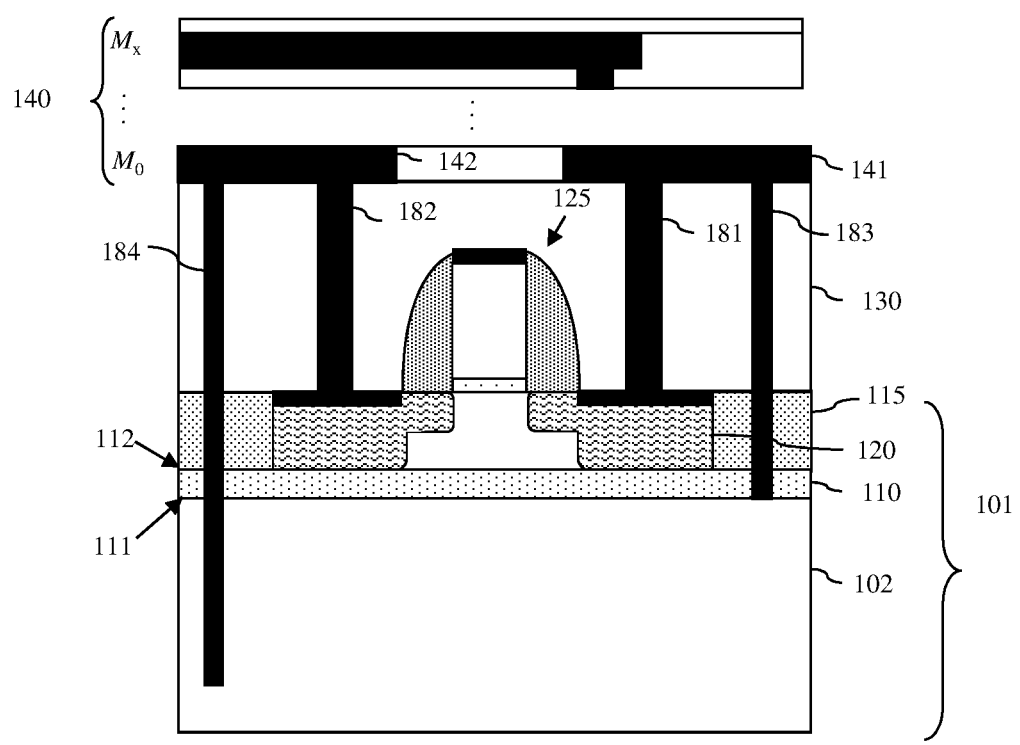

Various middle of the line (MOL) contacts and optional through BOX vias (TBVs) and/or through substrate vias (TSVs) can be formed (see FIG. 10). Specifically, MOL contacts can be formed that extend vertically from the top surface of the ILD layer(s) 130 to the semiconductor device(s) 125 (e.g., see contacts 181, 182 that extend to the FET source/drain regions). If, for example, functional semiconductor feature(s) are to be formed below the insulator layer at process 612 (discussed in detail below), one or more TBVs can, optionally, be formed (e.g., see the TBV 183, which extends vertically from the top surface of the ILD layer(s) 130, through the ILD layer(s) 130, through the isolation regions 115 within the semiconductor layer 120, through the insulator layer 110 and into the semiconductor handler substrate 102). If, for example, metal device(s) are to be formed below the insulator layer at process 614 (discussed in detail below), one or more TSVs can, optionally, be formed (e.g., see the TSV 184, which extends vertically from the top surface of the ILD layer(s) 130, through the ILD layer(s) 130, through the isolation regions 115 within the semiconductor layer 120, through the insulator layer 110 and to the top surface of the semiconductor handler substrate 102). BEOL metal levels 140 ($M_o$-$M_x$) can be formed above the ILD layer(s) 130. These BEOL metal levels 140 can contain the wires and vias that interconnect on-chip devices and/or enable connection to off-chip devices. For example, see wires 141 and 142, which are in the first metal level ($M_0$) and which are each immediately adjacent to the contacts 181 and 182, respectively, in order to electrically connect the semiconductor device 125 to other on-chip device and/or off-chip devices (not shown). For purposes of illustration only two metal levels 140 are shown in the figures (namely, the first metal level ($M_0$) (i.e., the lowest metal level) and the last metal level ($M_x$) (i.e., the highest metal level)); however, it should be understood that multiple additional metal levels would be stacked between the first and last metal levels. It should also be noted that, if optional TBVs and/or TSVs are formed, as discussed above, wires in any of the metal levels 140 (e.g., the first metal level ($M_0$), as shown, or higher metal levels) can also be formed immediately adjacent to the TBVs and/or TSVs (e.g., see wires 141 and 142, which are in contact with TBV 183 and TSV 184, respectively). Various techniques are well known in the art for forming MOL contacts, TBVs, TSVs and BEOL metal levels and, thus, the details of those techniques have been omitted from this specification in order to allow the reader to focus on the salient aspects of the disclosed methods.

The following processes are shown (unless otherwise stated) with respect to a partially completed IC structure that does not include any optional TBVs or TSVs. However, it should be understood that essentially the same processes could be performed with respect to a partially completed IC structure that includes one or more TBVs or TSVs.

Figure 11:
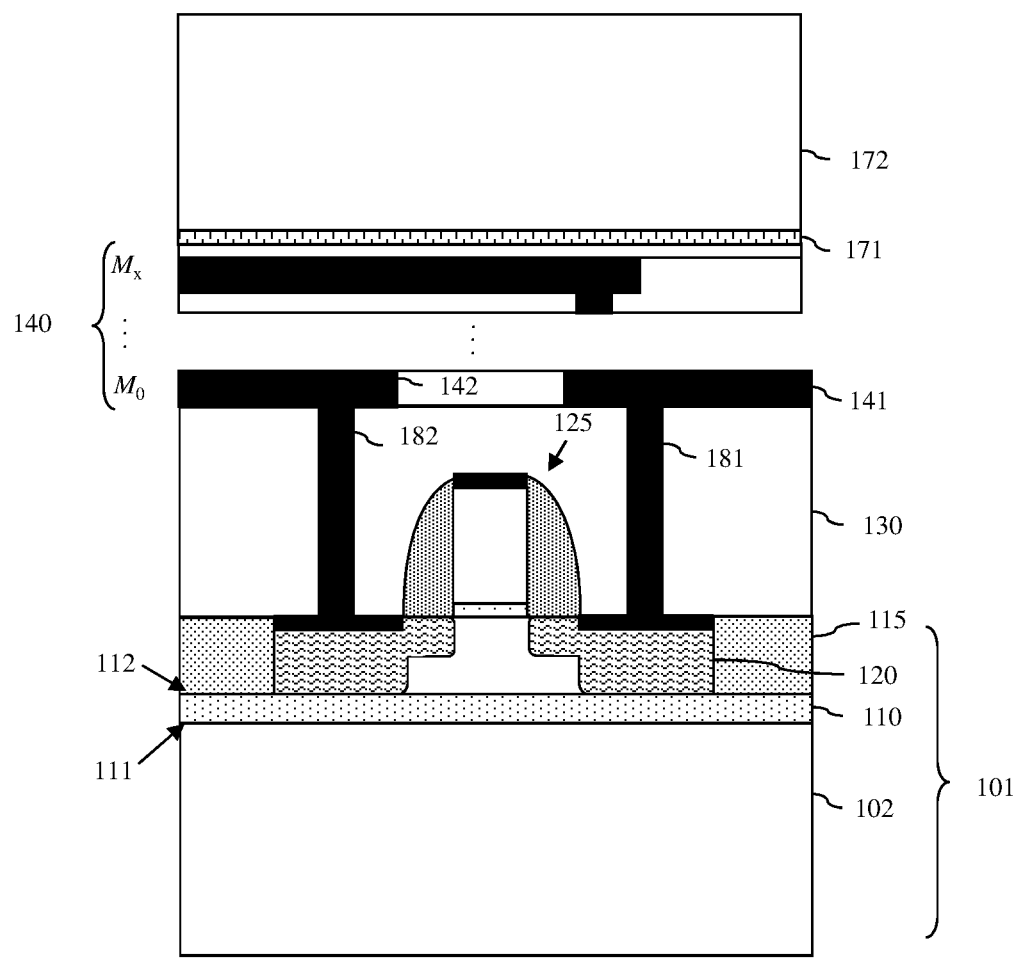

Following formation of the BEOL metal levels 140, a temporary carrier 172 can be attached to the wafer above the last metal level ($M_x$) (606, see FIG. 11). This temporary carrier 172 can be, for example, a glass carrier, a ceramic carrier or any other suitable carrier, and can be attached using an adhesive 171.

After the temporary carrier 172 is attached, the semiconductor handler substrate 102 can be removed (in part or in whole) from the first surface 111 of the insulator layer 110 (608) and can be replaced with a replacement handler substrate, which, optionally, contains functional semiconductor and/or metal features, as described in greater detail below (see process steps 610, 612 or 614). It should be noted that the orientation of the partially completed structures shown in the figures is not intended to be limiting. Specifically, while the partially completed structures are shown with the backside down, those skilled in the art will recognize that, after the temporary carrier 172 is attached, the partially completed structures can be flipped in order to remove all or part of the semiconductor handler substrate 102 and replace it as described.

Figure 12:
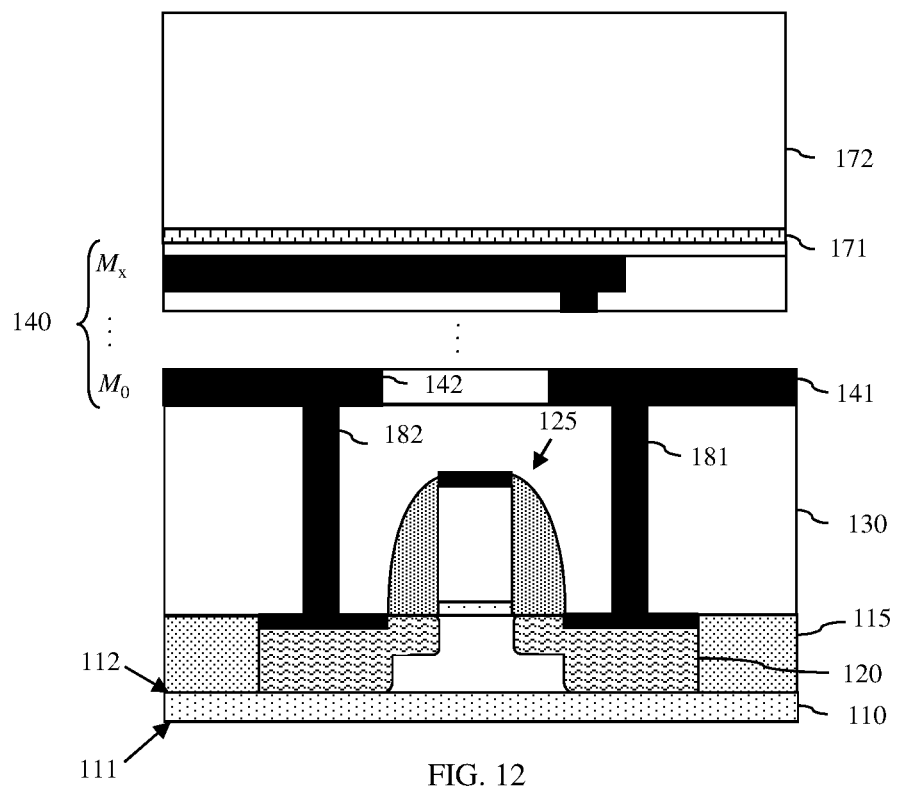
Figure 13:
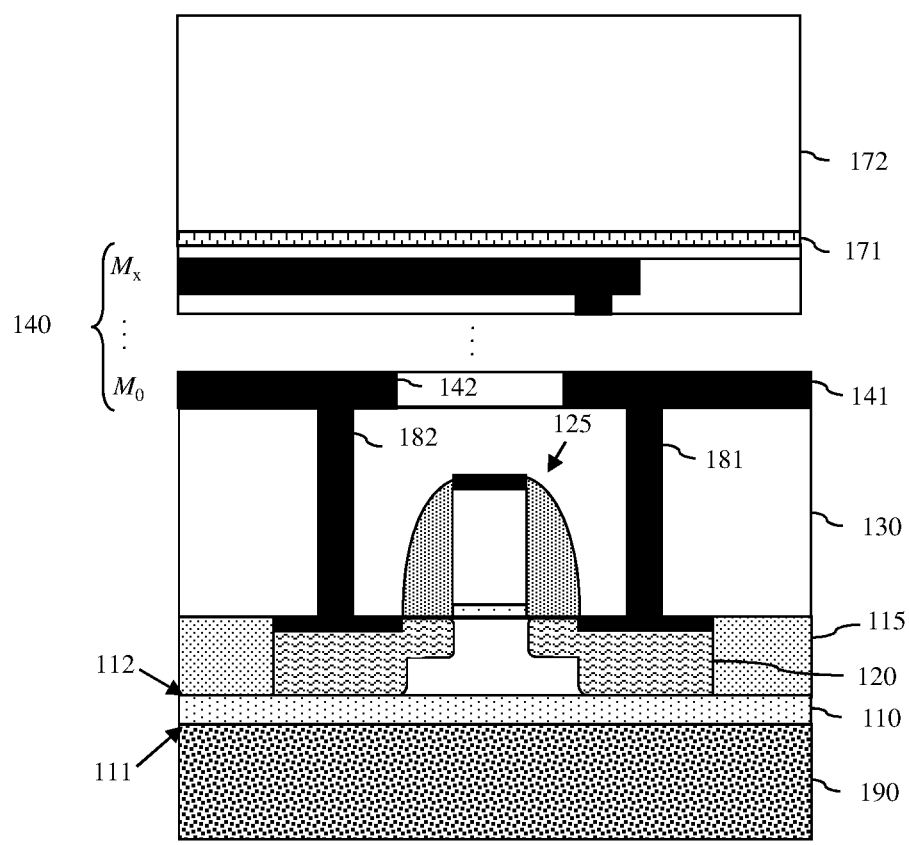

In one particular embodiment, the entire semiconductor handler substrate 102 can be removed at process 608 exposing the first surface 111 of the insulator layer 110 (see FIG. 12) and replaced at process 610 with a replacement handler substrate 190 (see FIG. 13). Removal of the semiconductor handler substrate 102 can be performed, for example, using a combination of grinding and etch processes to avoid damaging the insulator layer 110. The replacement handler substrate 190 can then be formed immediately adjacent to the first surface 111 of the insulator layer 110. The replacement handler substrate 190 can be made of a molding compound material using a molding tool, as discussed in greater detail below. After the replacement handler substrate 190 is formed, the temporary carrier 172 can be removed (616, see the IC chip structure 100A of FIG. 1).

In other method embodiments, the semiconductor handler substrate 102 can be partially removed at process 608 so that a semiconductor body 161 remains on the first surface 111 of the insulator layer 110 and, then, the removed portion of the semiconductor handler substrate can be replaced at process 612 with a replacement handler substrate 190 that contains the semiconductor body 161.

Figure 14:
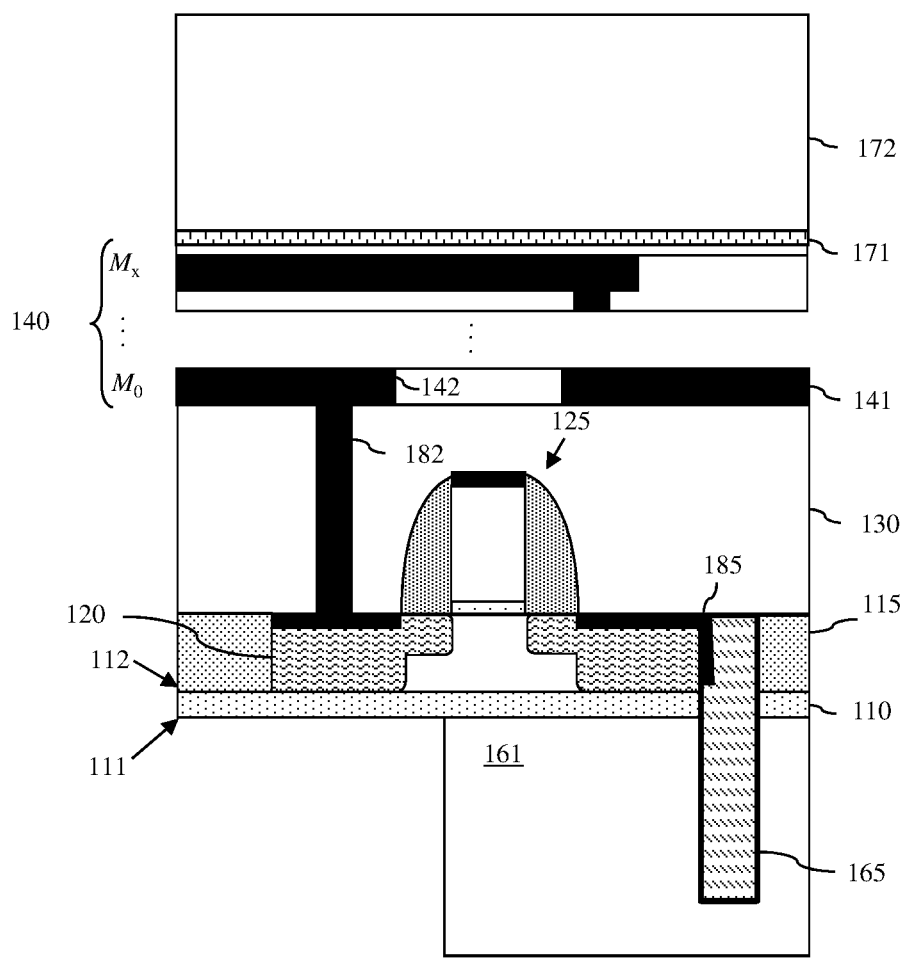
Figure 15:
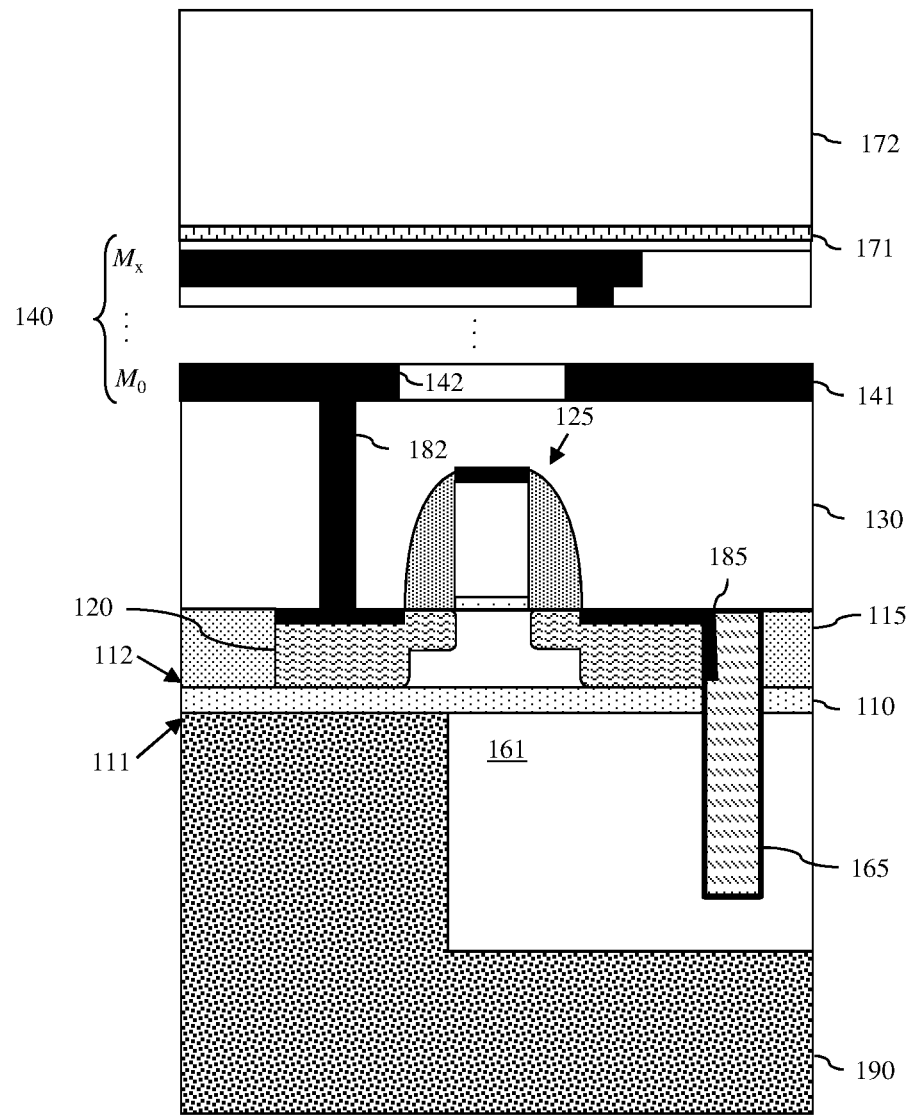

For example, one such method embodiment is illustrated with respect to the partially completed structure shown in FIG. 8A, which contains a deep trench capacitor 165 that extends through the insulator layer 110 and into the semiconductor handler substrate 102. In this case, the semiconductor handler substrate 102 can be thinned (e.g., using a grinding process), if necessary. The semiconductor handler substrate 102 can then be lithographically patterned and etched such that at least one portion (referred to herein as a semiconductor body 161), which contains the deep trench capacitor 165, remains immediately adjacent to the first surface 111 of the insulator layer 110 (see FIG. 14). Thus, the first surface of the insulator layer 110 will have an unexposed section, which is covered by the semiconductor body 161 that contains the deep trench capacitor 165, and an exposed section. The replacement handler substrate 190 can then be formed such that it contains the semiconductor body 161. That is, the replacement handler substrate 190 can be formed immediately adjacent to the exposed section of the first surface 111 of the insulator layer 110, positioned laterally adjacent to the semiconductor body 161 and further extending over (i.e., covering) the semiconductor body 161 (see FIG. 15). After the replacement handler substrate 190 is formed, the temporary carrier 172 can be removed (616, see the IC chip structure 100B of FIG. 2).

Figure 16:
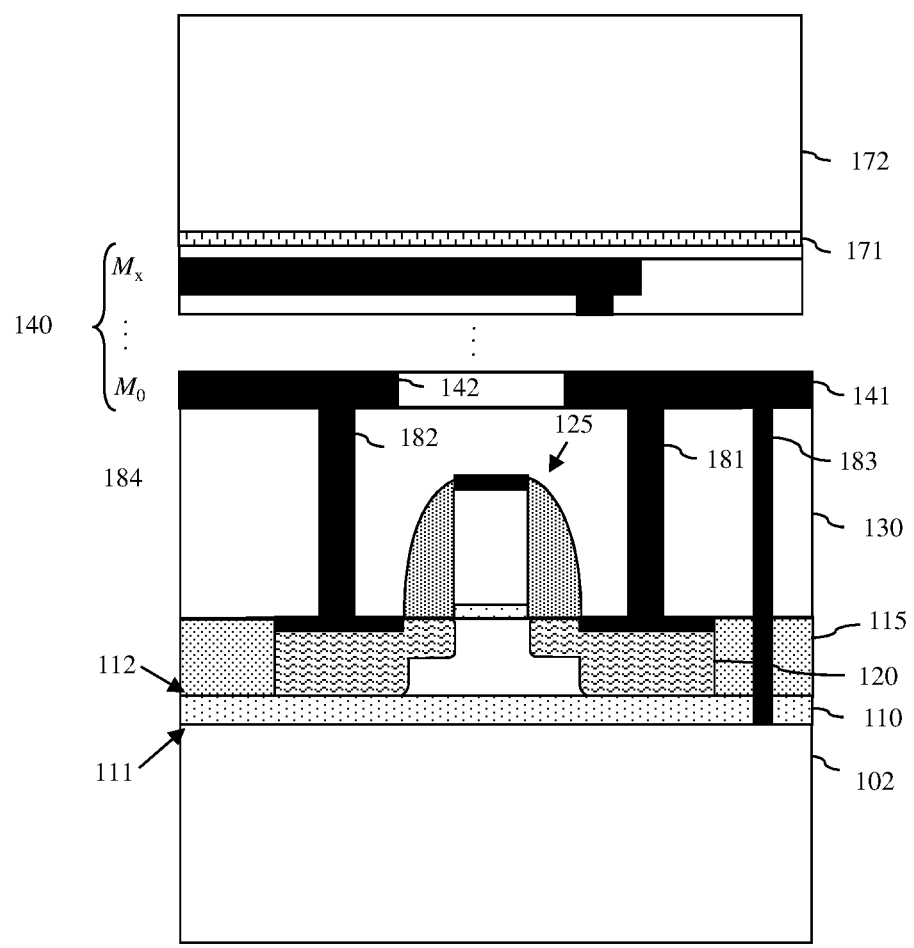
Figure 17:
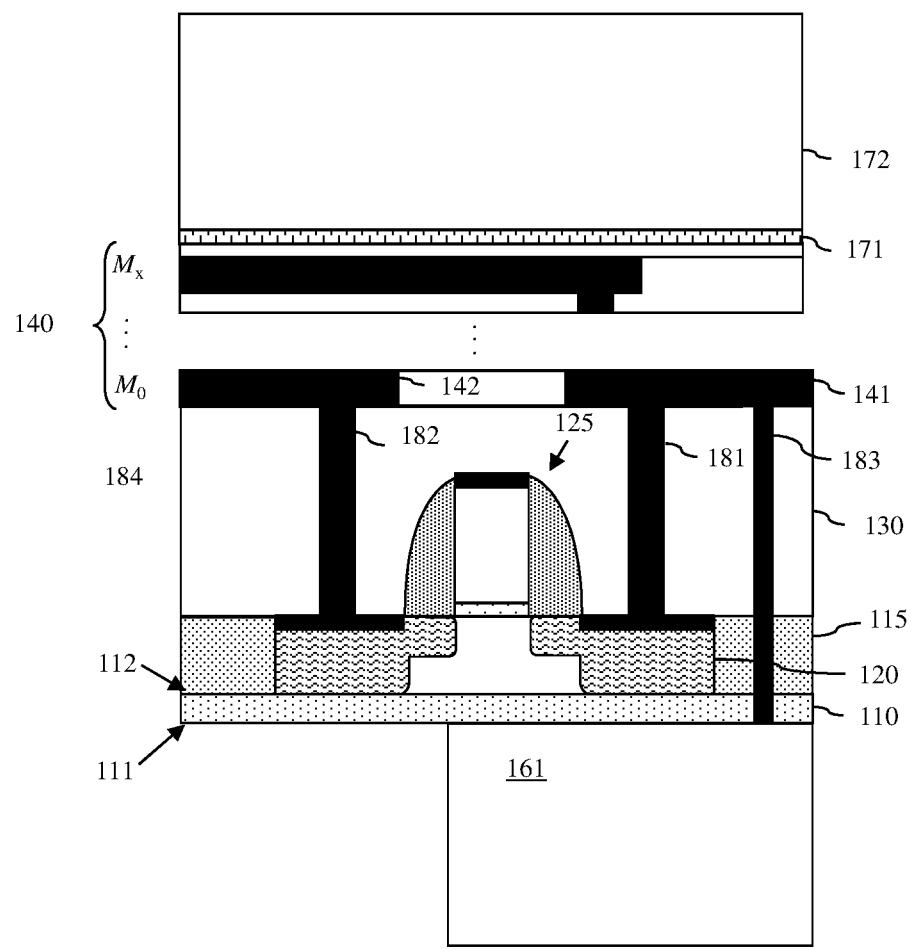
Figure 18:
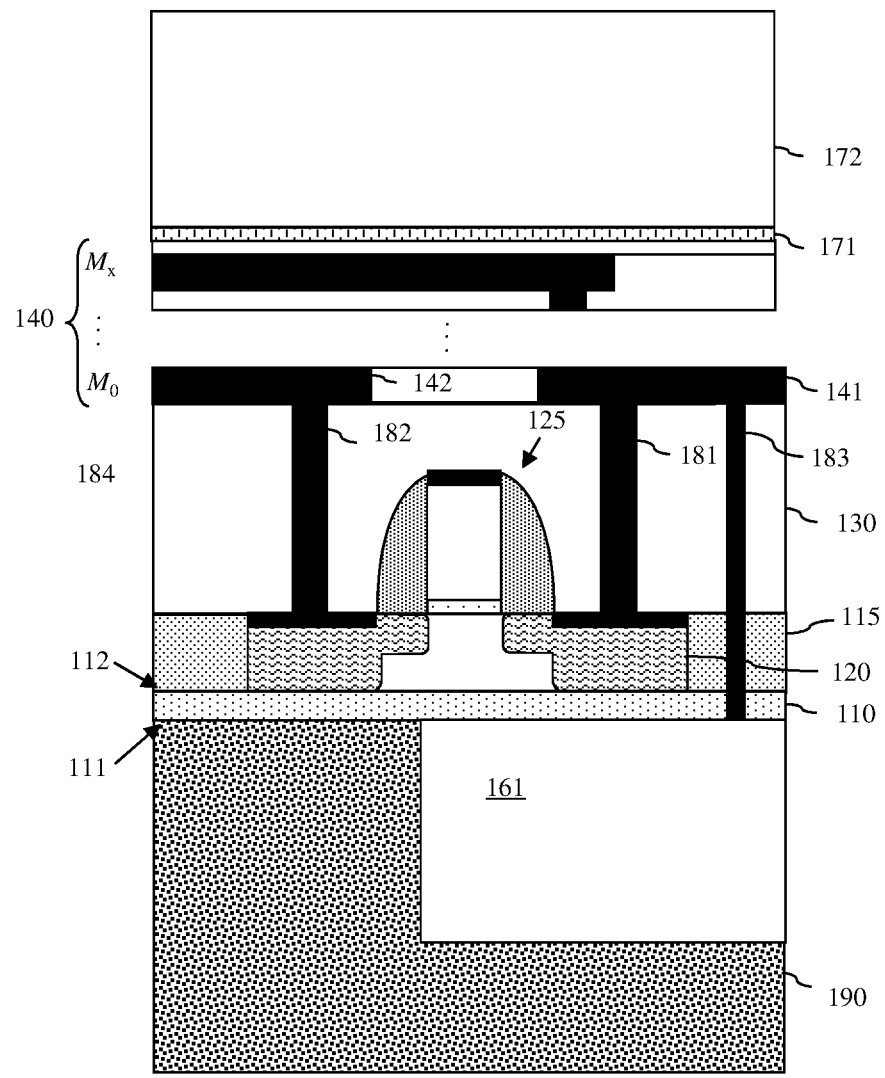

Another such embodiment is illustrated with respect to a partially completed structure as shown in FIG. 16, which contains at least one TBV 183 that extends to the top surface of the semiconductor handler substrate 102. In this case, the semiconductor handler substrate 102 can be thinned (e.g., using a grinding process), if necessary. The semiconductor handler substrate 102 can then be lithographically patterned and etched such that at least one portion (referred to herein as a semiconductor body 161) remains immediately adjacent to the first surface 111 of the insulator layer 110 (see FIG. 17). Thus, the first surface 111 of the insulator layer 110 will have an unexposed section covered by the semiconductor body 161 and an exposed section. Additional processing can be performed, before or after this thinning process, to configure the semiconductor body 161 as a functional semiconductor feature. For example, the semiconductor body 161 can be appropriately doped or otherwise processed so as to form any of the following: another semiconductor device; a conductive, biasable, field plate; a heat sink or any other functional semiconductor feature. It should be noted that the lithographic patterning and etch processes, which are used to form the semiconductor body 161, can be performed such that the semiconductor body 161 is immediately adjacent to one or more TBVs 183. For purposes of illustration, a single TBV 183 is shown as contacting the semiconductor body 161. However, it should be understood that the semiconductor body 161 might be contacted by more than one TBV or no TBV at all, depending upon the type of feature formed. Alternatively, the semiconductor body 161 that remains on the first surface 111 of the insulator layer 110 can be a support structure only (i.e., an uncontacted, undoped semiconductor body that is simply left on the first surface 111 of the insulator layer 110 to provide mechanical stability). The replacement handler substrate 190 can then be formed such that it contains the semiconductor body 161 (see FIG. 18). That is, the replacement handler substrate 190 can be formed immediately adjacent to the exposed section of the first surface 111 of the insulator layer 110, positioned laterally adjacent to the semiconductor body 161 and further extending over (i.e., covering) the semiconductor body 161. After the replacement handler substrate 190 is formed, the temporary carrier 172 can be removed (616, see the IC chip structure 100B' of FIG. 3).

Figure 19:
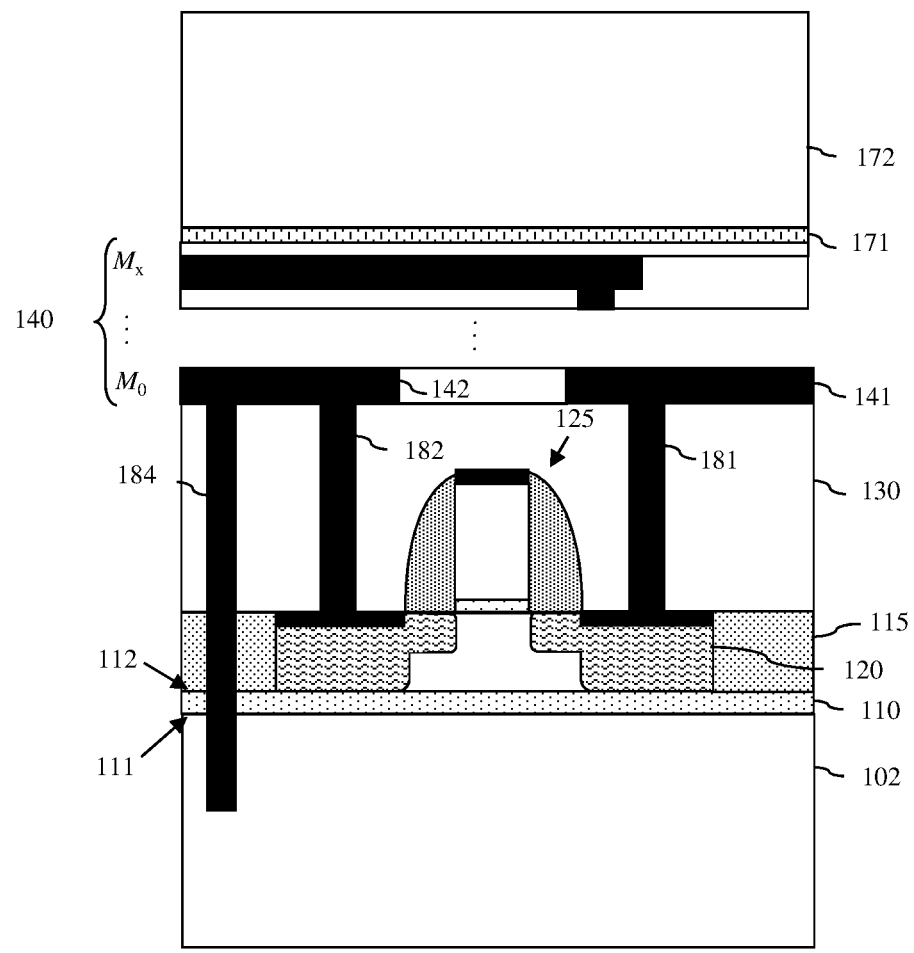
Figure 20:
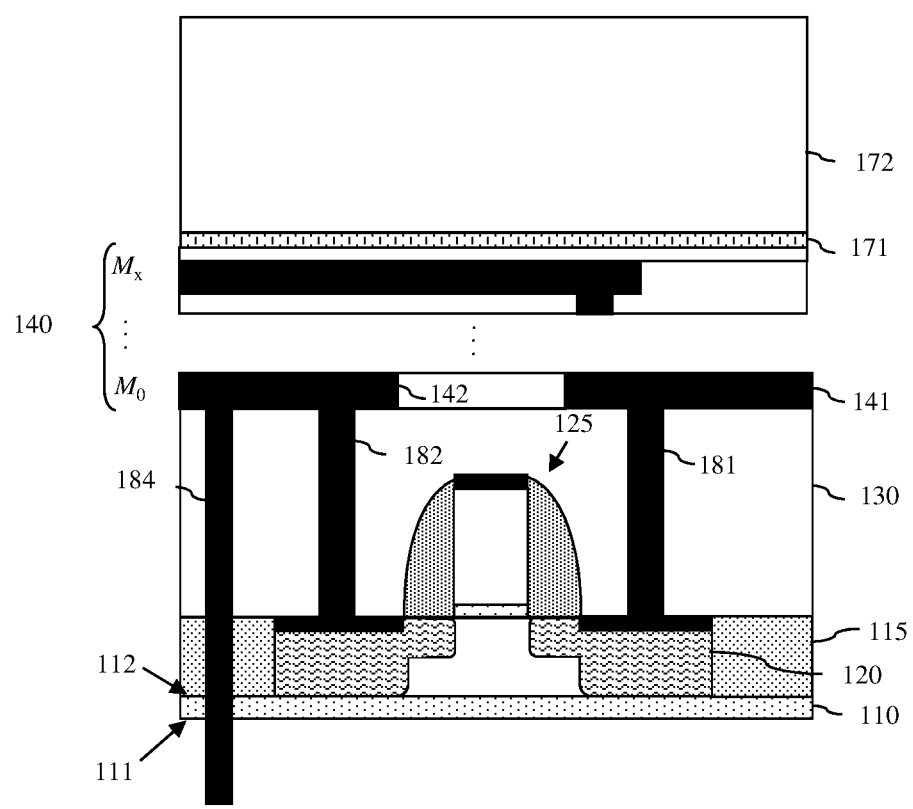

In yet another method embodiment, the semiconductor handler substrate 102 can be removed at process 608 and replaced at process 614 with a replacement handler substrate 190 that contains at least one metal device 162. This method embodiment is illustrated with respect to a partially completed structure as shown in FIG. 19, which has at least one TSV 184 that extends into the semiconductor handler substrate 102. Removal of the semiconductor handler substrate 102 can be performed, for example, using a grinding process to thin the semiconductor handler substrate 102 preferably without exposing the TSV 184 in order to prevent damage of the TSV 184. Subsequently, optional polishing and then etching processes can be performed to expose the first surface 111 of the insulator layer 110, leaving the TSV 184 intact. That is, the semiconductor handler substrate 102 is removed and an end portion of the TSV will extend beyond the first surface 111 of the insulator layer 110 (see FIG. 20).

Figure 21:
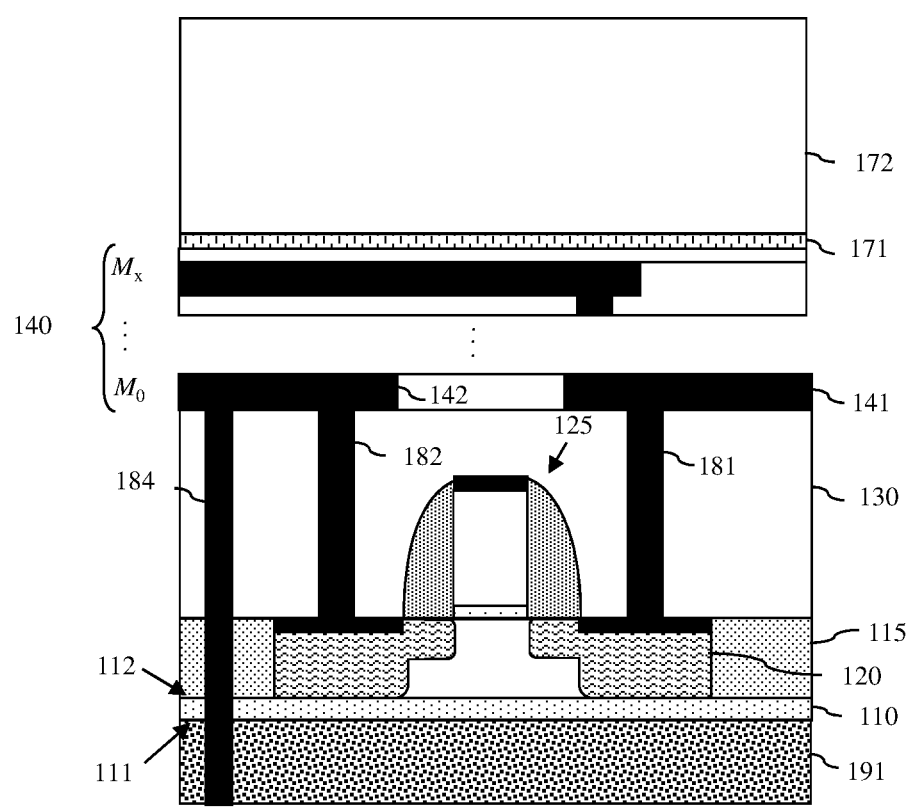

Next, a multi-layer replacement handler substrate can be formed and, during formation of the multi-layer replacement handler substrate one or more metal devices can be formed between the layers. For example, a first molding compound layer 191 can be formed on the first surface 111 of the insulator layer 110, laterally surrounding the end portion of the TSV 184. The first molding compound layer 191 can subsequently be polished or etched back to ensure the end of the TSV 184 is exposed (see FIG. 21).

Figure 22:
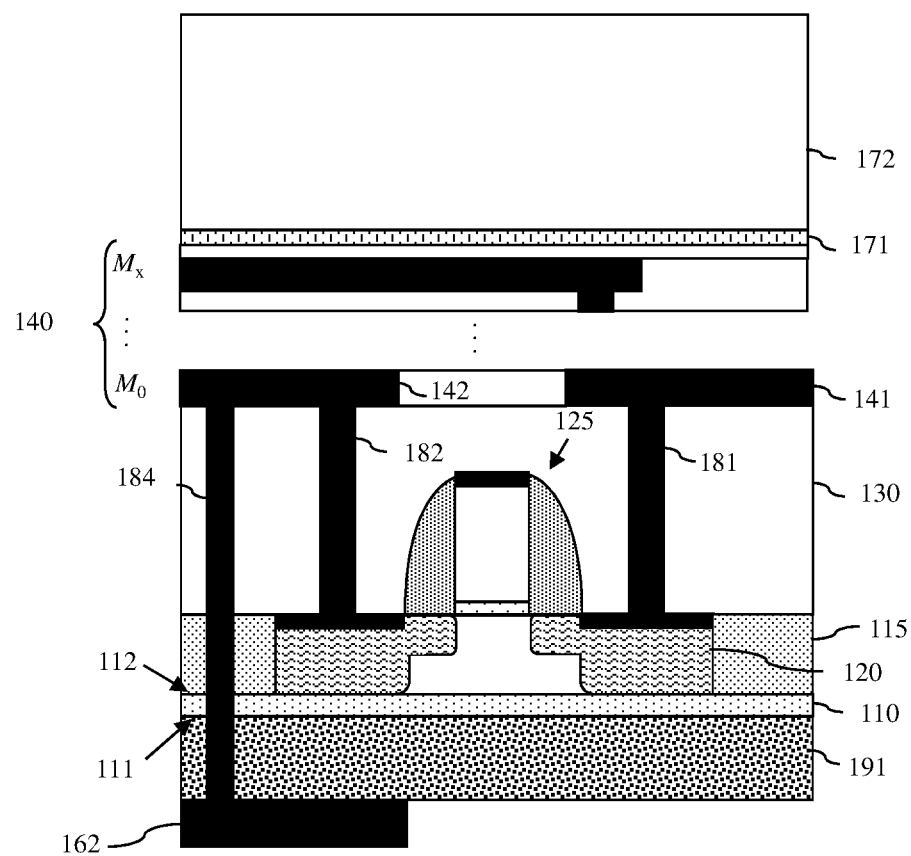

At least one metal device 162 can be formed on the first molding compound layer 191 (see FIG. 22). The metal device 162 can be any of the following: an inductor or other passive device (e.g., a capacitor or resistor); an antenna (e.g., an RF antenna to allow for transmission and receipt of RF signals); a conductive, biasable, field plate; a heat sink; a metal interconnect (e.g., a wire), which provides the electrical connection between on-chip features or between on-chip and off-chip features, or any other suitable type of metal device. Various techniques are well known in the art for forming such metal devices (e.g., in BEOL metal levels). Essentially the same techniques could be used to form a metal device 162 on a molding compound layer and, thus, the details of those techniques have been omitted from the specification in order to allow the reader to focus on the salient aspects of the disclosed methods. The metal device 162 can be formed such that it is immediately adjacent to one or more TSVs 184. For purposes of illustration, a single TSV 184 is shown as contacting the metal device 162. However, it should be understood that the metal device 162 might be contacted by more than one TSV or no TSV at all, depending upon the type of metal device formed.

Figure 23:
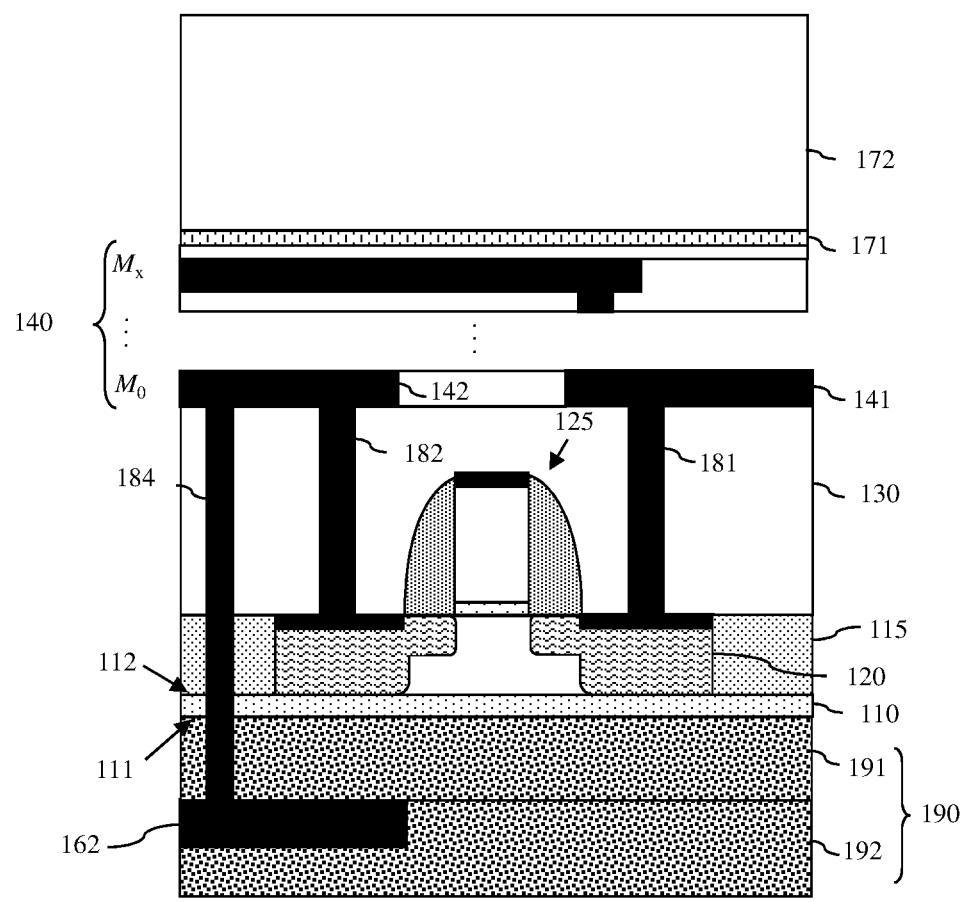

Following metal device formation, a second molding compound layer 192 can further be formed such that it is on the first molding compound layer 191 and extends over (i.e., covers) the metal device 162 (see FIG. 23). Thus, in the resulting structure, the replacement handler substrate 190 is a multi-layer replacement handler substrate with at least two molding compound layers 191, 192 and a metal device 162 between those layers. After the replacement handler substrate 190 is formed, the temporary carrier 172 can be removed (616, see the IC chip structure 100C of FIG. 4).

In yet other method embodiments, the processes 612 and 614, described in detail above and illustrated in the Figures, can be combined so that the semiconductor handler substrate 102 is removed and replaced with a replacement handler substrate 190 that contains both a semiconductor body 161 and a metal device 162. After the replacement handler substrate 190 is formed, the temporary carrier 172 can be removed (616). It should be noted that FIG. 5 shows an IC structure 100D that results from a combination of the method steps described above and used to form the IC structures of 100B of FIGS. 2 and 100C of FIG. 4. However, FIG. 5 is not intended to be limiting and it is anticipated that the method steps described above and used to form the IC structures of 100B' of FIGS. 3 and 100C of FIG. 4 could similarly be combined.

For purposes of illustration, the multi-layer replacement handler substrate is shown in FIGS. 4 and 5 as being formed as a two-layer replacement handler substrate containing only a single metal device between the layers. However, FIGS. 4 and 5 are not intended to be limiting. It should be understood that in the disclosed methods the multi-layer replacement handler substrate could, alternatively, be formed so as to include more than two molding compound layers with multiple metal devices of the same or different types between the same or different molding compound layers (i.e., at the same or different metal levels within the multi-layer replacement handler substrate 190). Additionally, the multi-layer replacement handler substrate could also be formed so as to include other material layers (e.g., photosensitive polyimide (PSPI), hard mask layers, etc.) between the molding compound layers. Additionally, the multi-layer replacement handler substrate can be formed so as to contain local interconnects and/or vias to connect the metal devices to each other, to other on-chip devices and/or off-chip devices (not shown).

In any case, in each of the method embodiments described above, the molding compound material used to form the replacement handler substrate 190 at process 610, 612 or 614 may be, for example, an organic, polymer, plastic, or epoxy material or any other suitable molding compound material. The molding compound material may further contain filler particles, which are distributed approximately uniformly throughout the material. The filler particles can all be the same type of filler particle. Alternatively, different types of filler particles could be used. For example, the molding compound material can contain filler particles that are electrically insulative and non-thermally conductive such as glass particles, silica particles, or any other suitable electrically insulative, non-thermally conductive, filler particles). Additionally or alternatively, the molding compound material can contain filler particles that are both electrically insulative and thermally conductive such as aluminum oxide particles, magnesium oxide particles, aluminum nitride particles, or any other suitable electrically insulative, thermally conductive, filler particles. Additionally or alternatively, the molding compound could contain filler particles that are electrically conductive (e.g., SiC), but the molding compound material (e.g., the organic or polymer material) can provide the necessary insulative properties. In any case, the size of the filler particles could range from several tens of microns to nano-particles. For purposes of this disclosure, an electrically insulative particle has an electrical resistivity ($\rho_e$) of greater than $1\times10^{14}$ Ωcm at room temperature (e.g., 20° C.) and a thermally conductive particle has a thermal conductivity (κ) of at least 15 W/mK at room temperature.

Those skilled in the art will recognize that such molding compound material, in its unprocessed state, is typically found in the form of solid pellets, powder, or other particulate. Alternatively, it may be found in the form of semi-solid or paste. In any case, to form the replacement handler substrate 190 (or each layer thereof, if applicable), unprocessed molding compound material may be placed on all surface(s) to be covered and then subjected, by a molding tool or press, to predetermined process parameters (e.g., temperature and/or pressure parameters) so as to form a molding compound layer. The parameters are set to ensure melting of the pellets, powder or particulate (if applicable) and curing of the resultant molding compound layer so that it is attached to and covers the surface(s) to be covered. Alternatively, the molding compound can be partially cured during the molding operation and curing can be completed afterwards.

It should be noted that the orientation of the partially completed structures shown FIGS. 11-23 is not intended to be limiting. Specifically, while the partially completed structures are shown with the backside down, those skilled in the art will recognize that, after the temporary carrier 172 is attached and until it is removed, the partially completed structures can be flipped in order to remove and replace the handler substrate, as described.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are integrated circuit (IC) chip structures (e.g., radio frequency (RF) IC chip structures) and methods of forming the structures with an electrically insulative molding compound handler substrate. Specifically, each of the disclosed IC chip structures includes at least: an electrically insulative molding compound handler substrate; an insulator layer on the handler substrate; and one or more semiconductor devices (e.g., RF semiconductor devices) on the insulator layer. Process steps in each of the disclosed methods include at least: attaching a temporary carrier above back end of the line (BEOL) metal levels, which are over an interlayer dielectric layer covering one or more semiconductor devices; removing at least a portion of a semiconductor handler substrate, which is below the semiconductor device(s) and separated therefrom by an insulator layer; replacing the semiconductor handler substrate with a replacement handler substrate made of an electrically insulative molding compound; and removing the temporary carrier. The molding compound handler substrate provides backside isolation that prevents unwanted noise coupling of devices.

What is claimed is:

1. An integrated circuit (IC) chip comprising:
   a replacement handler substrate comprising a molding compound, the molding compound being electrically insulative;
   an insulator layer having a first surface immediately adjacent to the replacement handler substrate and a second surface opposite the first surface;
   at least one semiconductor device on the second surface; and
   a semiconductor body immediately adjacent to the first surface,
   wherein the semiconductor body comprises any of an additional semiconductor device and a biasable conductive field plate, and
   wherein the replacement handler substrate is on the first surface of the insulator layer positioned laterally adjacent to the semiconductor body and further extends over the semiconductor body.

2. The integrated circuit (IC) chip of claim 1, wherein the molding compound is thermally conductive.

3. The integrated circuit (IC) chip of claim 1, wherein the molding compound comprises an organic material with filler particles.

4. The integrated circuit (IC) chip of claim 1, wherein the semiconductor device has a first portion aligned above the semiconductor body and a second portion that extends laterally beyond the semiconductor body such that the semiconductor device is partially offset from the semiconductor body.

5. The integrated circuit (IC) chip of claim 1,
   wherein the replacement handler substrate comprises:
      a first molding compound layer immediately adjacent to the first surface of the insulator layer; and,
      a second molding compound layer on the first molding compound layer, and
   wherein the integrated circuit (IC) chip further comprises:
      a metal device between the first molding compound layer and the second molding compound layer such that a top of the metal device is physically separated from the first surface of the insulator layer by the first molding compound layer and a bottom of the metal device is completely covered by the second molding compound layer; and
      a through substrate via extending vertically from the top of the metal device through the first molding compound layer and the insulator layer, wherein the through substrate via enables an electrical connection between the metal device and the semiconductor device.

6. The integrated circuit (IC) chip of claim 5, further comprising:
   an isolation region on the second surface of the insulator layer and positioned laterally adjacent to the semiconductor device;
   at least one interlayer dielectric layer over the semiconductor device and the isolation region;
   a metal level above the interlayer dielectric layer and comprising a wire; and,
   a contact extending vertically from the wire through the interlayer dielectric layer to the semiconductor device, wherein the through substrate via further extends vertically through the isolation region and the interlayer dielectric layer to the wire.

7. The integrated circuit (IC) chip of claim 5, wherein the metal device comprises any of an inductor, a passive device, and an antenna.

8. A method comprising:
   providing a wafer comprising a semiconductor handler substrate, an insulator layer having a first surface immediately adjacent to the semiconductor handler substrate and a second surface opposite the first surface, and a semiconductor layer on the second surface;
   forming at least one semiconductor device using the semiconductor layer and further forming a functional semiconductor feature using the semiconductor handler substrate, wherein the functional semiconductor feature comprises any of an additional semiconductor device and a biasable conductive field plate;
   forming at least one interlayer dielectric layer over the semiconductor device;
   forming metal levels above the interlayer dielectric layer;
   attaching a temporary carrier above the metal levels;
   patterning the semiconductor handler substrate such that a semiconductor body remains adjacent to the first surface, wherein the semiconductor body comprises the functional semiconductor feature;
   replacing a removed portion of the semiconductor handler substrate with a replacement handler substrate, the replacement handler substrate comprising an electrically insulative molding compound that is positioned laterally adjacent to and extends over the semiconductor body; and
   removing the temporary carrier.

9. The method of claim 8, wherein the molding compound is thermally conductive.

10. The method of claim 8, wherein the molding compound comprises an organic material with filler particles.

11. The method of claim 8, wherein the patterning is performed such that the semiconductor device has a first portion aligned above the semiconductor body and a second portion that extends laterally beyond the semiconductor body.

12. The method of claim 8,
wherein the forming of the functional semiconductor feature comprises forming a capacitor, and
wherein the forming of the capacitor comprises:
forming a trench through the semiconductor layer and the insulator layer and into the semiconductor handler substrate;
forming a doped region for a first conductive field plate in the semiconductor handler substrate adjacent to the trench;
lining the trench with a dielectric layer for a capacitor dielectric; and
filling the trench with a doped semiconductor material for a second conductive field plate.

13. The method of claim 8, further comprising:
forming at least one through substrate via that extends vertically from a top surface of the interlayer dielectric layer into the semiconductor handler substrate;
during the removing, leaving the through substrate via intact; and,
during the replacing, forming a first molding compound layer immediately adjacent to the first surface of the insulator layer and around the through substrate via and the semiconductor body; forming a metal device on the first molding compound layer opposite the first surface of the insulator layer such that a top of the metal device is physically separated from the first surface of the insulator layer and in contact with the through substrate via, wherein the metal device comprises any of an inductor, a passive device, and an antenna; and forming a second molding compound layer on the first molding compound layer and extending laterally over the metal device such that a bottom of the metal device is completely covered by the second molding compound layer,
wherein the replacement handler substrate comprises the first molding compound layer and the second molding compound layer and contains the metal device, and
wherein the through substrate via enables an electrical connection between the metal device and the semiconductor device.

14. The integrated circuit (IC) chip of claim 1, further comprising:
an isolation region on the second surface of the insulator layer and positioned laterally adjacent to the semiconductor device;
at least one interlayer dielectric layer over the semiconductor device and the isolation region;
a metal level above the interlayer dielectric layer and comprising a wire;
a contact extending vertically from the wire through the interlayer dielectric layer to the semiconductor device; and
a via extending vertically from the wire through the interlayer dielectric layer, the isolation region and the insulator layer to the semiconductor body.

15. the integrated circuit (IC) chip of claim 1,
wherein the additional semiconductor device comprises a capacitor comprising: a first conductive field plate; a second conductive field plate; and a capacitor dielectric between the first conductive field plate and the second conductive field plate,
wherein the first conductive field plate comprises a doped region within the semiconductor body,
wherein the capacitor dielectric comprises a dielectric layer lining a trench that extends vertically through the insulator layer into the doped region of the semiconductor body, and
wherein the second conductive field plate comprises a doped semiconductor material on the dielectric layer and filling the trench.

16. An integrated circuit (IC) chip comprising:
a replacement handler substrate comprising a molding compound, the molding compound being electrically insulative;
an insulator layer having a first surface immediately adjacent to the replacement handler substrate and a second surface opposite the first surface;
at least one semiconductor device on the second surface; and
a metal device within the replacement handler substrate, wherein a top of the metal device is physically separated from the first surface of the insulator layer by the molding compound and wherein a bottom of the metal device is completely covered by the molding compound.

17. The integrated circuit (IC) chip of claim 16,
wherein the replacement handler substrate comprises:
a first molding compound layer immediately adjacent to the first surface of the insulator layer; and,
a second molding compound layer on the first molding compound layer,
wherein the metal device is between the first molding compound layer and the second molding compound layer, and
wherein the integrated circuit (IC) chip further comprises a through substrate via extending vertically from the top of the metal device through the first molding compound layer and the insulator layer.

18. The integrated circuit (IC) chip of claim 17, further comprising:
an isolation region on the second surface of the insulator layer and positioned laterally adjacent to the semiconductor device;
at least one interlayer dielectric layer over the semiconductor device and the isolation region;
a metal level above the interlayer dielectric layer and comprising a wire; and,
a contact extending vertically from the wire through the interlayer dielectric layer to the semiconductor device, wherein the through substrate via further extends vertically through the isolation region and the interlayer dielectric layer to the wire.

19. The integrated circuit (IC) chip of claim 16, wherein the metal device comprises any of an inductor, a passive device, and an antenna.

20. The integrated circuit (IC) chip of claim 16, further comprising a semiconductor body immediately adjacent to the first surface of the insulator layer and covered by the replacement handler substrate, wherein the semiconductor body comprises any of an additional semiconductor device and a biasable conductive field plate.

* * * * *